United States Patent
Rathburn

(10) Patent No.: US 10,609,819 B2
(45) Date of Patent: Mar. 31, 2020

(54) HYBRID PRINTED CIRCUIT ASSEMBLY WITH LOW DENSITY MAIN CORE AND EMBEDDED HIGH DENSITY CIRCUIT REGIONS

(71) Applicant: HSIO Technologies, LLC, Maple Grove, MN (US)

(72) Inventor: James J. Rathburn, Maple Grove, MN (US)

(73) Assignee: HSIO Technologies, LLC, Maple Grove, MN (US)

(*) Notice: Subject to any disclaimer, the term of this patent is extended or adjusted under 35 U.S.C. 154(b) by 127 days.

(21) Appl. No.: 15/609,047

(22) Filed: May 31, 2017

(65) Prior Publication Data

US 2017/0303401 A1    Oct. 19, 2017

Related U.S. Application Data

(63) Continuation of application No. 14/408,205, filed on Dec. 15, 2014, now Pat. No. 9,699,906, and a
(Continued)

(51) Int. Cl.
*H05K 5/00* (2006.01)
*H05K 1/18* (2006.01)
(Continued)

(52) U.S. Cl.
CPC .............. *H05K 1/181* (2013.01); *B33Y 80/00* (2014.12); *H01L 23/4985* (2013.01);
(Continued)

(58) Field of Classification Search
CPC .......... H05K 1/18; H05K 1/181; H05K 1/182; H05K 2201/095; H05K 2201/09509;
(Continued)

(56) References Cited

U.S. PATENT DOCUMENTS

| 3,672,986 A | 6/1972 | Schneble |
| 4,188,438 A | 2/1980 | Burns |

(Continued)

FOREIGN PATENT DOCUMENTS

| JP | 2003/217774 | 7/2003 |
| JP | 3274601 | 3/2009 |

(Continued)

OTHER PUBLICATIONS

Notification of Transmittal of the International Search Report and the Written Opinion of the International Searching Authority dated Jul. 30, 2010 in International Application No. PCT/US2010/036043.
(Continued)

*Primary Examiner* — Binh B Tran

(57) ABSTRACT

A high density region for a low density circuit. At least a first liquid dielectric layer is deposited on the first surface of a first circuitry layer. The dielectric layer is imaged to create plurality of first recesses. Surfaces of the first recesses are plated electro-lessly with a conductive material to form first conductive structures electrically coupled to, and extending generally perpendicular to, the first circuitry layer. A plating resist is applied. A conductive material is electro-plated to the first conductive structure to substantially fill the first recesses, and the plating resist is removed.

11 Claims, 19 Drawing Sheets

Related U.S. Application Data continuation-in-part of application No. 14/238,638, filed as application No. PCT/US2013/030856 on Mar. 13, 2013, now Pat. No. 9,603,249, application No. 15/609,047, which is a continuation-in-part of application No. 13/413,724, filed on Mar. 7, 2012, now Pat. No. 8,987,886, and a continuation-in-part of application No. 13/320,285, filed as application No. PCT/US2010/036282 on May 27, 2010, now Pat. No. 9,414,500.

(60) Provisional application No. 61/669,884, filed on Jul. 10, 2012, provisional application No. 61/523,379, filed on Aug. 14, 2011, provisional application No. 61/451,685, filed on Mar. 11, 2011, provisional application No. 61/183,340, filed on Jun. 2, 2009.

(51) Int. Cl.
| | | |
|---|---|---|
| *H01L 23/498* | (2006.01) | |
| *H05K 1/11* | (2006.01) | |
| *H05K 3/10* | (2006.01) | |
| *H05K 3/40* | (2006.01) | |
| *H05K 3/46* | (2006.01) | |
| *B33Y 80/00* | (2015.01) | |
| *H05K 3/12* | (2006.01) | |
| *H05K 1/02* | (2006.01) | |
| *H05K 7/00* | (2006.01) | |
| *H05K 1/16* | (2006.01) | |
| *H05K 3/20* | (2006.01) | |
| *H05K 3/24* | (2006.01) | |
| *H05K 3/28* | (2006.01) | |

(52) U.S. Cl.
CPC ......... *H05K 1/0216* (2013.01); *H05K 1/0256* (2013.01); *H05K 1/0284* (2013.01); *H05K 1/118* (2013.01); *H05K 3/107* (2013.01); *H05K 3/1258* (2013.01); *H05K 3/4007* (2013.01); *H05K 3/4664* (2013.01); *H05K 3/4694* (2013.01); *H01L 2224/16* (2013.01); *H01L 2924/09701* (2013.01); *H01L 2924/12044* (2013.01); *H01L 2924/3011* (2013.01); *H05K 1/0221* (2013.01); *H05K 1/0274* (2013.01); *H05K 1/16* (2013.01); *H05K 3/207* (2013.01); *H05K 3/246* (2013.01); *H05K 3/28* (2013.01); *H05K 2201/0344* (2013.01); *H05K 2201/0367* (2013.01); *H05K 2201/09109* (2013.01); *H05K 2201/10674* (2013.01); *H05K 2201/10734* (2013.01); *Y10T 29/49155* (2015.01)

(58) Field of Classification Search
CPC ......... H05K 2201/09518; H05K 2201/09527; H05K 2201/09536; H05K 2201/09545; H05K 2201/09563; H05K 2201/09572; H05K 2201/0959; H05K 2201/096
USPC .............. 361/748, 760–764, 783; 174/254, 174/260–263
See application file for complete search history.

(56) References Cited

U.S. PATENT DOCUMENTS

| | | |
|---|---|---|
| 4,295,700 A | 10/1981 | Sado |
| 4,489,999 A | 12/1984 | Miniet |
| 4,922,376 A | 5/1990 | Pommer et al. |
| 4,959,515 A | 9/1990 | Zavracky |
| 4,964,948 A | 10/1990 | Reed |
| 5,014,159 A | 5/1991 | Butt |
| 5,046,238 A | 9/1991 | Daigle |
| 5,071,363 A | 12/1991 | Reylek et al. |
| 5,072,520 A | 12/1991 | Nelson |
| 5,090,116 A | 2/1992 | Henschen |
| 5,096,426 A | 3/1992 | Simpson et al. |
| 5,127,837 A | 7/1992 | Shah et al. |
| 5,129,573 A | 7/1992 | Duffey |
| 5,161,983 A | 11/1992 | Ohno |
| 5,167,512 A | 12/1992 | Walkup |
| 5,208,068 A | 5/1993 | Davis et al. |
| 5,237,203 A | 8/1993 | Massaron |
| 5,246,880 A | 9/1993 | Reele et al. |
| 5,286,680 A | 2/1994 | Cain |
| 5,334,029 A | 8/1994 | Akkapeddi et al. |
| 5,358,621 A | 10/1994 | Oyama |
| 5,378,981 A | 1/1995 | Higgins, III |
| 5,419,038 A | 5/1995 | Wang et al. |
| 5,454,161 A | 10/1995 | Beilin et al. |
| 5,479,319 A | 12/1995 | Werther et al. |
| 5,509,019 A | 4/1996 | Yamamura |
| 5,527,998 A | 6/1996 | Anderson et al. |
| 5,534,787 A | 7/1996 | Levy |
| 5,562,462 A | 10/1996 | Matsuba et al. |
| 5,596,178 A | 1/1997 | Christian |
| 5,619,018 A | 4/1997 | Rossi |
| 5,659,181 A | 8/1997 | Bridenbaugh |
| 5,674,595 A | 10/1997 | Busacco et al. |
| 5,691,041 A | 11/1997 | Frankeny et al. |
| 5,716,663 A | 2/1998 | Capote et al. |
| 5,741,624 A | 4/1998 | Jeng et al. |
| 5,746,608 A | 5/1998 | Taylor |
| 5,761,801 A | 6/1998 | Gebhardt et al. |
| 5,764,485 A | 6/1998 | Lebaschi |
| 5,772,451 A | 6/1998 | Dozler et al. |
| 5,785,538 A | 7/1998 | Beaman et al. |
| 5,787,976 A | 8/1998 | Hamburgen et al. |
| 5,802,699 A | 9/1998 | Fjelstad et al. |
| 5,802,711 A | 9/1998 | Card et al. |
| 5,819,579 A | 10/1998 | Roberts |
| 5,880,590 A | 3/1999 | Desai et al. |
| 5,904,546 A | 5/1999 | Wood et al. |
| 5,913,109 A | 6/1999 | Distefano et al. |
| 5,921,786 A | 7/1999 | Slocum et al. |
| 5,925,931 A | 7/1999 | Yamamoto |
| 5,933,558 A | 8/1999 | Sauvageau et al. |
| 5,973,394 A | 10/1999 | Slocum et al. |
| 6,020,597 A | 2/2000 | Kwak |
| 6,062,879 A | 5/2000 | Beaman et al. |
| 6,080,932 A | 6/2000 | Smith et al. |
| 6,107,109 A | 8/2000 | Akram et al. |
| 6,114,240 A | 9/2000 | Akram et al. |
| 6,118,426 A | 9/2000 | Albert |
| 6,120,588 A | 9/2000 | Jacobson |
| 6,137,687 A | 10/2000 | Shirai et al. |
| 6,172,879 B1 | 1/2001 | Cilia et al. |
| 6,177,921 B1 | 1/2001 | Comiskey |
| 6,178,540 B1 | 1/2001 | Lo et al. |
| 6,181,144 B1 | 1/2001 | Hembree et al. |
| 6,200,143 B1 | 3/2001 | Haba et al. |
| 6,207,259 B1 | 3/2001 | Iino et al. |
| 6,225,692 B1 | 5/2001 | Hinds |
| 6,247,938 B1 | 6/2001 | Rathburn |
| 6,252,564 B1 | 6/2001 | Albert |
| 6,255,126 B1 | 7/2001 | Mathieu et al. |
| 6,263,566 B1 | 7/2001 | Hembree et al. |
| 6,270,363 B1 | 8/2001 | Brofman et al. |
| 6,288,451 B1 | 9/2001 | Tsao |
| 6,312,971 B1 | 11/2001 | Amundson |
| 6,313,528 B1 | 11/2001 | Solberg |
| 6,320,256 B1 | 11/2001 | Ho |
| 6,350,386 B1 | 2/2002 | Lin |
| 6,359,790 B1 | 3/2002 | Meyer-Berg |
| 6,413,790 B1 | 7/2002 | Duthaler |
| 6,422,687 B1 | 7/2002 | Jacobson |
| 6,428,328 B2 | 8/2002 | Haba et al. |
| 6,433,427 B1 | 8/2002 | Wu et al. |
| 6,437,452 B2 | 8/2002 | Lin |
| 6,437,591 B1 | 8/2002 | Farnworth et al. |
| 6,459,418 B1 | 10/2002 | Comiskey |

(56) References Cited

U.S. PATENT DOCUMENTS

| | | |
|---|---|---|
| 6,461,183 B1 | 10/2002 | Ohkita |
| 6,462,418 B2 | 10/2002 | Sakamoto et al. |
| 6,462,568 B1 | 10/2002 | Cram |
| 6,477,286 B1 | 11/2002 | Ouchi |
| 6,490,786 B2 | 12/2002 | Belke et al. |
| 6,494,725 B2 | 12/2002 | Lin et al. |
| 6,506,438 B2 | 1/2003 | Duthaler et al. |
| 6,521,489 B2 | 2/2003 | Duthaler |
| 6,545,291 B1 | 4/2003 | Amundson |
| 6,572,396 B1 | 6/2003 | Rathburn |
| 6,574,114 B1 | 6/2003 | Brindle et al. |
| 6,593,535 B2 | 7/2003 | Gailus |
| 6,603,080 B2 | 8/2003 | Jensen |
| 6,614,104 B2 | 9/2003 | Farnworth et al. |
| 6,626,526 B2 | 9/2003 | Ueki |
| 6,639,578 B1 | 10/2003 | Comiskey |
| 6,642,127 B2 | 11/2003 | Kumar et al. |
| 6,652,075 B2 | 11/2003 | Jacobson |
| 6,661,084 B1 | 12/2003 | Peterson et al. |
| 6,662,442 B1 | 12/2003 | Matsui et al. |
| 6,709,967 B2 | 3/2004 | Evers |
| 6,744,126 B1 | 6/2004 | Chiang |
| 6,750,473 B2 | 6/2004 | Amundson |
| 6,758,691 B1 | 7/2004 | McHugh |
| 6,765,288 B2 | 7/2004 | Damberg |
| 6,773,302 B2 | 8/2004 | Gutierrez et al. |
| 6,796,810 B2 | 9/2004 | DelPrete |
| 6,800,169 B2 | 10/2004 | Liu et al. |
| 6,809,414 B1 | 10/2004 | Lin et al. |
| 6,821,131 B2 | 11/2004 | Suzuki et al. |
| 6,823,124 B1 | 11/2004 | Renn |
| 6,825,829 B1 | 11/2004 | Albert |
| 6,827,611 B1 | 12/2004 | Payne et al. |
| 6,830,460 B1 | 12/2004 | Rathburn |
| 6,840,777 B2 | 1/2005 | Sathe et al. |
| 6,853,087 B2 | 2/2005 | Neuhasu et al. |
| 6,856,151 B1 | 2/2005 | Cram |
| 6,857,880 B2 | 2/2005 | Ohtsuki |
| 6,861,345 B2 | 3/2005 | Ball et al. |
| 6,910,897 B2 | 6/2005 | Driscoll et al. |
| 6,946,325 B2 | 9/2005 | Yean et al. |
| 6,962,829 B2 | 11/2005 | Glenn et al. |
| 6,965,168 B2 | 11/2005 | Langhorn |
| 6,967,640 B2 | 11/2005 | Albert |
| 6,971,902 B2 | 12/2005 | Taylor |
| 6,987,661 B1 | 1/2006 | Huemoeller et al. |
| 6,992,376 B2 | 1/2006 | Jaeck |
| 7,009,413 B1 | 3/2006 | Alghouli |
| 7,025,600 B2 | 4/2006 | Higashi |
| 7,029,289 B2 | 4/2006 | Li |
| 7,040,902 B2 | 5/2006 | Li |
| 7,045,015 B2 | 5/2006 | Renn |
| 7,049,838 B2 | 5/2006 | Kagami |
| 7,064,412 B2 | 6/2006 | Geissinger et al. |
| 7,070,419 B2 | 7/2006 | Brown et al. |
| 7,095,090 B2 | 8/2006 | Nakajima et al. |
| 7,101,210 B2 | 9/2006 | Lin |
| 7,114,960 B2 | 10/2006 | Rathburn |
| 7,118,391 B2 | 10/2006 | Minich et al. |
| 7,121,837 B2 | 10/2006 | Sato et al. |
| 7,121,839 B2 | 10/2006 | Rathburn |
| 7,129,166 B2 | 10/2006 | Speakman |
| 7,138,328 B2 | 11/2006 | Downey et al. |
| 7,145,228 B2 | 12/2006 | Yean et al. |
| 7,148,128 B2 | 12/2006 | Jacobson |
| 7,154,175 B2 | 12/2006 | Shrivastava et al. |
| 7,157,799 B2 | 1/2007 | Noquil et al. |
| 7,180,313 B2 | 2/2007 | Bucksch |
| 7,217,996 B2 | 5/2007 | Cheng et al. |
| 7,220,287 B1 | 5/2007 | Wyrzykowska et al. |
| 7,229,293 B2 | 6/2007 | Sakurai et al. |
| 7,232,263 B2 | 6/2007 | Sashinaka et al. |
| 7,244,967 B2 | 7/2007 | Hundt et al. |
| 7,249,954 B2 | 7/2007 | Weiss |
| 7,276,919 B1 | 10/2007 | Beaman et al. |
| 7,297,003 B2 | 11/2007 | Rathburn |
| 7,301,105 B2 | 11/2007 | Vasoya |
| 7,321,168 B2 | 1/2008 | Tao |
| 7,326,064 B2 | 2/2008 | Rathburn |
| 7,327,006 B2 | 2/2008 | Svard et al. |
| 7,337,537 B1 | 3/2008 | Smetana, Jr. |
| 7,382,363 B2 | 6/2008 | Albert et al. |
| 7,402,515 B2 | 7/2008 | Arana et al. |
| 7,410,825 B2 | 8/2008 | Majumdar et al. |
| 7,411,304 B2 | 8/2008 | Kirby et al. |
| 7,417,299 B2 | 8/2008 | Hu |
| 7,417,314 B1 | 8/2008 | Lin et al. |
| 7,423,219 B2 | 9/2008 | Kawaguchi et al. |
| 7,427,717 B2 | 9/2008 | Morirnoto et al. |
| 7,432,600 B2 | 10/2008 | Klein et al. |
| 7,458,150 B2 | 12/2008 | Totokawa et al. |
| 7,459,393 B2 | 12/2008 | Farnworth et al. |
| 7,485,345 B2 | 2/2009 | Renn |
| 7,489,524 B2 | 2/2009 | Green et al. |
| 7,508,076 B2 | 3/2009 | Japp et al. |
| 7,527,502 B2 | 5/2009 | Li |
| 7,531,906 B2 | 5/2009 | Lee |
| 7,535,114 B2 | 5/2009 | Agraharam et al. |
| 7,536,415 B2 | 5/2009 | Lin et al. |
| 7,536,714 B2 | 5/2009 | Yuan |
| 7,537,461 B2 | 5/2009 | Rathburn |
| 7,563,645 B2 | 7/2009 | Jaeck |
| 7,595,454 B2 | 9/2009 | Kresge et al. |
| 7,619,309 B2 | 11/2009 | Drexl et al. |
| 7,621,761 B2 | 11/2009 | Mok et al. |
| 7,628,617 B2 | 12/2009 | Brown et al. |
| 7,632,106 B2 | 12/2009 | Nakamura |
| 7,645,635 B2 | 1/2010 | Wood et al. |
| 7,651,382 B2 | 1/2010 | Yasumura et al. |
| 7,656,163 B2 | 2/2010 | Renn |
| 7,658,617 B1 | 2/2010 | Brodsky |
| 7,674,671 B2 | 3/2010 | Renn |
| 7,726,984 B2 | 6/2010 | Bumb et al. |
| 7,736,152 B2 | 6/2010 | Hougham et al. |
| 7,748,110 B2 | 7/2010 | Asahi et al. |
| 7,758,351 B2 | 7/2010 | Brown et al. |
| 7,800,916 B2 | 9/2010 | Blackwell et al. |
| 7,833,832 B2 | 11/2010 | Wood et al. |
| 7,836,587 B2 | 11/2010 | Kim |
| 7,868,469 B2 | 1/2011 | Mizoguchi |
| 7,874,847 B2 | 1/2011 | Matsui et al. |
| 7,897,503 B2 | 3/2011 | Foster et al. |
| 7,898,087 B2 | 3/2011 | Chainer |
| 7,950,927 B2 | 5/2011 | Kazama |
| 7,955,088 B2 | 6/2011 | Di Stefano |
| 7,999,369 B2 | 8/2011 | Malhan et al. |
| 8,004,092 B2 | 8/2011 | Lin |
| 8,044,502 B2 | 10/2011 | Rathburn |
| 8,058,558 B2 | 11/2011 | Mok et al. |
| 8,072,058 B2 | 12/2011 | Kim et al. |
| 8,120,173 B2 | 2/2012 | Forman et al. |
| 8,144,687 B2 | 2/2012 | Mizoguchi |
| 8,148,643 B2 | 4/2012 | Hirose et al. |
| 8,154,119 B2 | 4/2012 | Yoon et al. |
| 8,158,503 B2 | 4/2012 | Abe |
| 8,159,824 B2 | 4/2012 | Cho et al. |
| 8,178,978 B2 | 5/2012 | McElrea et al. |
| 8,203,207 B2 | 6/2012 | Getz et al. |
| 8,227,703 B2 | 7/2012 | Maruyama et al. |
| 8,232,632 B2 | 7/2012 | Rathburn |
| 8,247,702 B2 | 8/2012 | Kouya |
| 8,278,141 B2 | 10/2012 | Chow et al. |
| 8,299,494 B2 | 10/2012 | Yilmaz et al. |
| 8,329,581 B2 | 12/2012 | Haba et al. |
| 8,344,516 B2 | 1/2013 | Chainer |
| 8,373,428 B2 | 2/2013 | Eldridge et al. |
| 8,421,151 B2 | 4/2013 | Yamashita |
| 8,525,322 B1 | 9/2013 | Kim et al. |
| 8,525,346 B2 | 9/2013 | Rathburn |
| 8,536,714 B2 | 9/2013 | Sakagushi |
| 8,536,889 B2 | 9/2013 | Nelson et al. |
| 8,610,265 B2 | 12/2013 | Rathburn |
| 8,618,649 B2 | 12/2013 | Rathburn |
| 8,704,377 B2 | 4/2014 | Rathbun |

(56) References Cited

U.S. PATENT DOCUMENTS

| | | |
|---|---|---|
| 8,758,067 B2 | 6/2014 | Rathburn |
| 8,789,272 B2 | 7/2014 | Rathbun |
| 8,803,539 B2 | 8/2014 | Rathbun |
| 8,829,671 B2 | 9/2014 | Rathburn |
| 8,911,266 B2 | 12/2014 | Kawate |
| 8,912,812 B2 | 12/2014 | Rathburn |
| 8,928,344 B2 | 1/2015 | Rathburn |
| 8,955,215 B2 | 2/2015 | Rathburn |
| 8,955,216 B2 | 2/2015 | Rathburn |
| 8,970,031 B2 | 3/2015 | Rathburn |
| 8,981,568 B2 | 3/2015 | Rathburn |
| 8,981,809 B2 | 3/2015 | Rathburn |
| 8,984,748 B2 | 3/2015 | Rathbun |
| 8,987,886 B2 | 3/2015 | Rathburn |
| 8,988,093 B2 | 3/2015 | Rathburn |
| 9,054,097 B2 | 6/2015 | Rathburn |
| 9,076,884 B2 | 7/2015 | Rathburn |
| 9,093,767 B2 | 7/2015 | Rathburn |
| 9,136,196 B2 | 9/2015 | Rathburn |
| 9,184,145 B2 | 11/2015 | Rathburn |
| 9,184,527 B2 | 11/2015 | Rathburn |
| 9,196,980 B2 | 11/2015 | Rathburn |
| 9,231,328 B2 | 1/2016 | Rathburn |
| 9,232,654 B2 | 1/2016 | Rathburn |
| 9,276,336 B2 | 3/2016 | Rathburn |
| 9,276,339 B2 | 3/2016 | Rathburn |
| 9,277,654 B2 | 3/2016 | Rathburn |
| 9,318,862 B2 | 4/2016 | Rathburn |
| 9,320,133 B2 | 4/2016 | Rathburn |
| 9,320,144 B2 | 4/2016 | Rathburn |
| 9,350,093 B2 | 4/2016 | Rathburn |
| 9,350,214 B2 | 5/2016 | Rathburn |
| 9,414,500 B2 | 8/2016 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0027441 A1 | 3/2002 | Akrma et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2002/0179334 A1 | 12/2002 | Curcio |
| 2003/0003779 A1 | 1/2003 | Rathburn |
| 2003/0096512 A1 | 5/2003 | Cornell |
| 2003/0114029 A1 | 6/2003 | Lee et al. |
| 2003/0117161 A1 | 6/2003 | Burns |
| 2003/0141884 A1 | 7/2003 | Maruyama et al. |
| 2003/0156400 A1 | 8/2003 | Dibene et al. |
| 2003/0162418 A1 | 8/2003 | Yamada |
| 2003/0164548 A1 | 9/2003 | Lee |
| 2003/0188890 A1 | 10/2003 | Bhatt et al. |
| 2003/0189083 A1 | 10/2003 | Olsen |
| 2003/0231819 A1 | 12/2003 | Palmer et al. |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0020116 A1 | 1/2005 | Kawazoe et al. |
| 2005/0048680 A1 | 3/2005 | Matsumani |
| 2005/0100294 A1 | 5/2005 | Nguyen et al. |
| 2005/0101164 A1 | 5/2005 | Rathburn |
| 2005/0162176 A1 | 7/2005 | Bucksch |
| 2005/0164527 A1 | 7/2005 | Radza et al. |
| 2005/0196511 A1 | 9/2005 | Garrity et al. |
| 2005/0253610 A1 | 11/2005 | Cram |
| 2006/0001152 A1 | 1/2006 | Hu |
| 2006/0006534 A1 | 1/2006 | Yean et al. |
| 2006/0012966 A1 | 1/2006 | Chakravorty |
| 2006/0022341 A1* | 2/2006 | Sir .......... H01L 21/486 257/758 |
| 2006/0024924 A1 | 2/2006 | Haji et al. |
| 2006/0044357 A1 | 3/2006 | Andersen |
| 2006/0087064 A1 | 4/2006 | Daniel et al. |
| 2006/0125500 A1 | 6/2006 | Watkins et al. |
| 2006/0145338 A1 | 7/2006 | Dong |
| 2006/0149491 A1 | 7/2006 | Flach et al. |
| 2006/0157103 A1 | 7/2006 | Sheats et al. |
| 2006/0160379 A1 | 7/2006 | Rathburn |
| 2006/0186906 A1 | 8/2006 | Bottoms et al. |
| 2006/0208230 A1 | 9/2006 | Cho et al. |
| 2006/0265919 A1 | 10/2006 | Huang |
| 2006/0258912 A1 | 11/2006 | Belson et al. |
| 2006/0261827 A1 | 11/2006 | Cooper et al. |
| 2006/0274510 A1 | 12/2006 | Nakada |
| 2006/0281303 A1 | 12/2006 | Trezza et al. |
| 2007/0021002 A1 | 1/2007 | Laurx et al. |
| 2007/0026999 A1 | 2/2007 | Merolle et al. |
| 2007/0035030 A1 | 2/2007 | Horton |
| 2007/0057382 A1 | 3/2007 | Liu et al. |
| 2007/0059901 A1 | 3/2007 | Majumdar et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0182431 A1 | 8/2007 | Komatsu et al. |
| 2007/0201209 A1 | 8/2007 | Francis et al. |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0267138 A1 | 11/2007 | White et al. |
| 2007/0273394 A1 | 11/2007 | Tanner et al. |
| 2007/0287304 A1 | 12/2007 | Eldridge |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0020624 A1 | 1/2008 | Nikaido et al. |
| 2008/0041822 A1 | 2/2008 | Wang |
| 2008/0057753 A1 | 3/2008 | Rathburn et al. |
| 2008/0060838 A1 | 3/2008 | Chen et al. |
| 2008/0073110 A1* | 3/2008 | Shioga .......... H05K 1/162 174/258 |
| 2008/0093115 A1 | 4/2008 | Lee |
| 2008/0115961 A1 | 5/2008 | Mok et al. |
| 2008/0117606 A1 | 5/2008 | Karlsson |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0039496 A1 | 2/2009 | Beer et al. |
| 2009/0047808 A1 | 2/2009 | Ma |
| 2009/0058444 A1 | 3/2009 | McIntyre |
| 2009/0061089 A1 | 3/2009 | King |
| 2009/0127698 A1 | 5/2009 | Rathburn |
| 2009/0133906 A1 | 5/2009 | Baek |
| 2009/0158581 A1 | 6/2009 | Nguyen et al. |
| 2009/0178273 A1* | 7/2009 | Lauffer .......... H05K 1/142 29/830 |
| 2009/0180236 A1 | 7/2009 | Lee et al. |
| 2009/0224404 A1 | 9/2009 | Wood et al. |
| 2009/0241332 A1* | 10/2009 | Lauffer .......... H05K 3/462 29/829 |
| 2009/0267628 A1 | 10/2009 | Takase |
| 2009/0321915 A1 | 12/2009 | Hu et al. |

(56) References Cited

U.S. PATENT DOCUMENTS

| | | |
|---|---|---|
| 2010/0030734 A1 | 2/2010 | Chunilal |
| 2010/0133680 A1 | 6/2010 | Kang et al. |
| 2010/0143194 A1 | 6/2010 | Lee et al. |
| 2010/0188112 A1 | 7/2010 | Yoshida |
| 2010/0213960 A1 | 8/2010 | Mok et al. |
| 2010/0244872 A1 | 9/2010 | Yoshida |
| 2010/0290501 A1 | 11/2010 | De Bruyker |
| 2011/0083881 A1 | 4/2011 | Nguyen et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0062270 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0002285 A1 | 1/2013 | Nelson |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0283922 A1 | 10/2013 | Qualtieri |
| 2013/0330942 A1 | 12/2013 | Rathburn |
| 2014/0043782 A1 | 2/2014 | Rathburn |
| 2014/0045350 A1 | 2/2014 | Taylor |
| 2014/0080258 A1 | 3/2014 | Rathburn |
| 2014/0192498 A1 | 7/2014 | Rathburn |
| 2014/0220797 A1 | 8/2014 | Rathburn |
| 2014/0225255 A1 | 8/2014 | Rathburn |
| 2014/0242816 A1 | 8/2014 | Rathburn |
| 2014/0273641 A1 | 9/2014 | Light |
| 2015/0013901 A1 | 1/2015 | Rathburn |
| 2015/0091600 A1 | 4/2015 | Rathburn |
| 2015/0136467 A1 | 5/2015 | Rathburn |
| 2015/0162678 A1 | 6/2015 | Rathburn |
| 2015/0181810 A1 | 7/2015 | Rathburn |

FOREIGN PATENT DOCUMENTS

| | | |
|---|---|---|
| WO | WO 1991/014015 | 9/1991 |
| WO | WO 2006/036277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |
| WO | WO 2011/153298 | 12/2011 |
| WO | WO 2012/061008 | 5/2012 |
| WO | WO 2012/074963 | 6/2012 |
| WO | WO 2012/074969 | 6/2012 |
| WO | WO 2012/078493 | 6/2012 |
| WO | WO 2012/122142 | 9/2012 |
| WO | WO 2012/125331 | 9/2012 |
| WO | WO 2013/036565 | 3/2013 |
| WO | WO 2014/011226 | 1/2014 |
| WO | WO 2014/011228 | 1/2014 |
| WO | WO 2014/011232 | 1/2014 |
| WO | WO 2015/006393 | 1/2015 |

OTHER PUBLICATIONS

Notification of Transmittal of the International Search Report and the Written Opinion of the International Searching Authority dated Jul. 21, 2010 in International Application No. PCT/US2010/036047.

Notification of Transmittal of the International Search Report and the Written Opinion of the International Searching Authority dated Jul. 28, 2010 in International Application No. PCT/US2010/036363.

Notification of Transmittal of the International Search Report and the Written Opinion of the International Searching Authority dated Jul. 28, 2010 in International Application No. PCT/US2010/036377.

Notification of Transmittal of the International Search Report and the Written Opinion of the International Searching Authority dated Jul. 30, 2010 in International Application No. PCT/US2010/036388.

Notification of Transmittal of the International Search Report and the Written Opinion of the International Searching Authority dated Jul. 27, 2010 in International Application No. PCT/US2010/036397.

Notification of Transmittal of the International Search Report and the Written Opinion of the International Searching Authority dated Jul. 30, 2010 in International Application No. PCT/US2010/036055.

Notification of Transmittal of the International Search Report and the Written Opinion of the International Searching Authority dated Aug. 4, 2010 in International Application No. PCT/US2010/036288.

Notification of Transmittal of the International Search Report and the Written Opinion of the International Searching Authority dated Aug. 4, 2010 in International Application No. PCT/US2010/036285.

Notification of Transmittal of the International Search Report and the Written Opinion of the International Searching Authority dated Jul. 30, 2010 in International Application No. PCT/US2010/036282.

Notification of Transmittal of the International Search Report and the Written Opinion of the International Searching Authority dated Jul. 30, 2010 in International Application No. PCT/US2010/036295.

Notification of Transmittal of the International Search Report and the Written Opinion of the International Searching Authority dated Jul. 30, 2010 in International Application No. PCT/US2010/036313.

Notification of Transmittal of the International Search Report and the Written Opinion of the International Searching Authority dated Aug. 3, 2010 in International Application No. PCT/US2010/037619.

(56) References Cited

OTHER PUBLICATIONS

Notification of Transmittal of the International Search Report and the Written Opinion of the International Searching Authority dated Sep. 7, 2010 in International Application No. PCT/US2010/038600.
Notification of Transmittal of the International Search Report and the Written Opinion of the International Searching Authority dated Aug. 18. 2010 in International Application No. PCT/US2010/038606.
Notification of Transmittal of the International Search Report and the Written Opinion of the International Searching Authority dated Sep. 1, 2010 in International Application No. PCT/US2010/040188.
Notification of Transmittal of the International Search Report and the Written Opinion of the International Searching Authority dated Aug. 20, 2010 in International Application No. PCT/US2010/040197.
Notification of Transmittal of the International Search Report and the Written Opinion of the International Searching Authority dated Apr. 14, 2011 in International Application No. PCT/US2011/023138.
Notification of Transmittal of the International Search Report and the Written Opinion of the International Searching Authority dated Aug. 17, 2011 in International Application No. PCT/US2011/033726.
Notification of Transmittal of the International Search Report and the Written Opinion of the International Searching Authority dated Sep. 27, 2011 in International Application No. PCT/US2011/038845.
Notification of Transmittal of the International Search Report and the Written Opinion of the International Searching Authority dated Feb. 8, 2012 in International Application No. PCT/US2011/056664.
Notification of Transmittal of the International Search Report and the Written Opinion of the International Searching Authority dated Mar. 26, 2012 in International Application No. PCT/US2011/062313.
Notification of Transmittal of the International Search Report and the Written Opinion of the International Searching Authority dated Jun. 20, 2012 in International Application No. PCT/US2012/027813.
Notification of Transmittal of the International Search Report and the Written Opinion of the International Searching Authority dated Jun. 19, 2012 in International Application No. PCT/US2012/027823.
Notification of Transmittal of the International Search Report and the Written Opinion of the International Searching Authority dated Nov. 29, 2012 in International Application No. PCT/US2012/053848.
Notification of Transmittal of the International Search Report and the Written Opinion of the International Searching Authority dated Jun. 3, 2013 in International Application No. PCT/US2013/031395.
Notification of Transmittal of the International Search Report and the Written Opinion of the International Searching Authority dated Jun. 19, 2013 in International Application No. PCT/US2013/030981.
Notification of Transmittal of the International Search Report and the Written Opinion of the International Searching Authority dated Jun. 7, 2013 in International Application No. PCT/US2013/030856.
Notification of Transmittal of the International Search Report and the Written Opinion of the International Searching Authority dated Oct. 27, 2014 in International Application No. PCT/US2014/045856.
Tarzwell, Robert, "A Real Printed Electronic Replacement for PCB Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: The Next Generation of PCBs?" PCB007 Magazine, Apr. 28, 2009.
Liu, et al, "All-Polymer Capacitor Fabricated with Inkjet Printing Technique," Solid-State Electronics, vol. 47, pp. 1543-1548 (2003).
Print—Definition of Print by the Free Dictionary, http://www.thefreedictionary.com/print. Aug. 13, 2014.
European Search Report for EP 3 076 772 A3 dated Sep. 9, 2016.
European Search Report for EP 14 82 2548 dated Nov. 2, 2016.

* cited by examiner

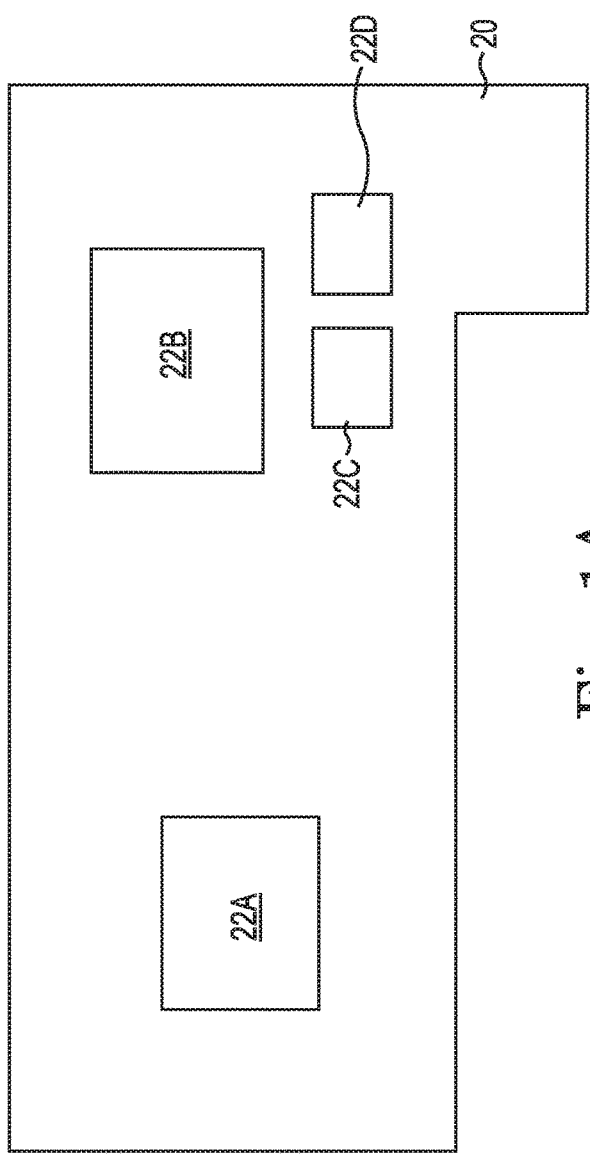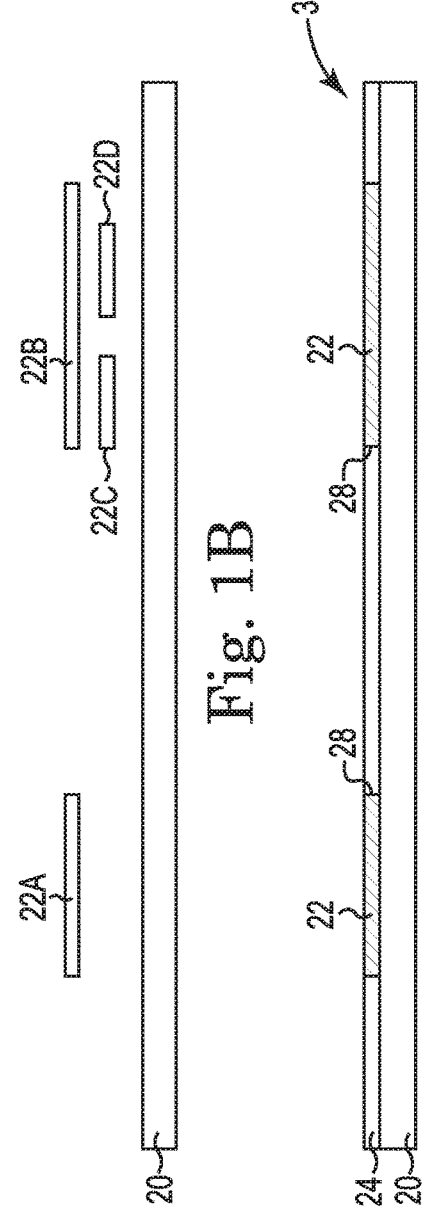
Fig. 1A
Fig. 1B
Fig. 1C

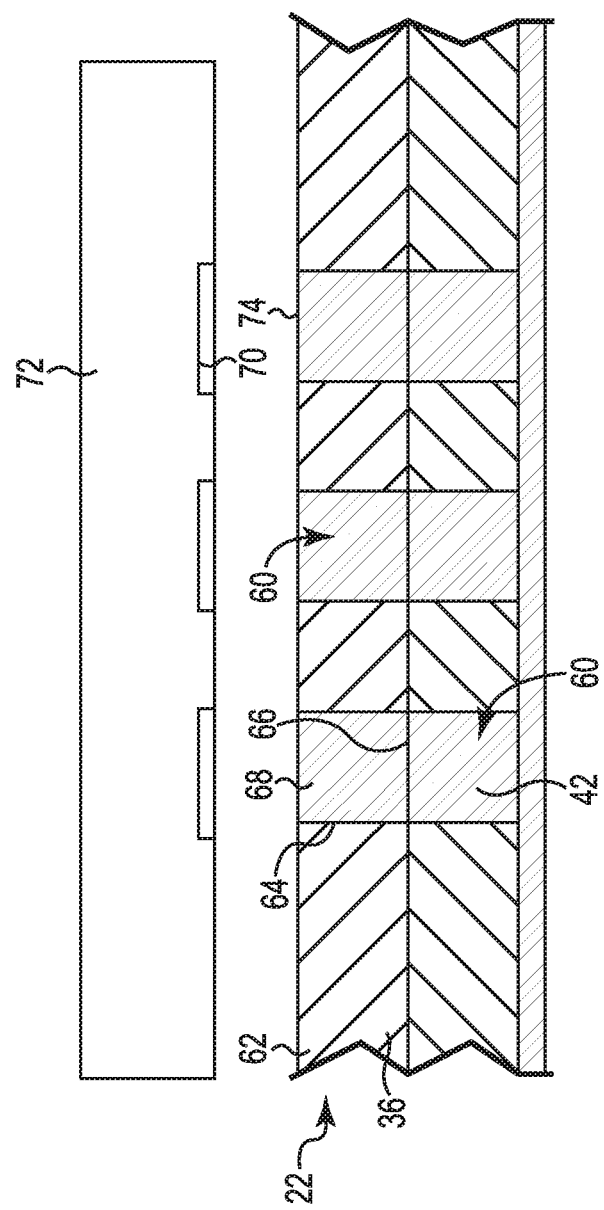

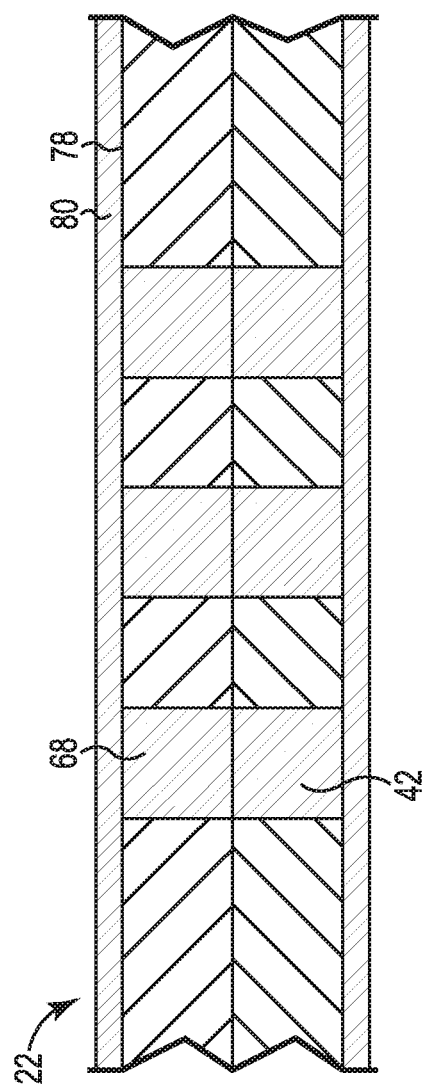

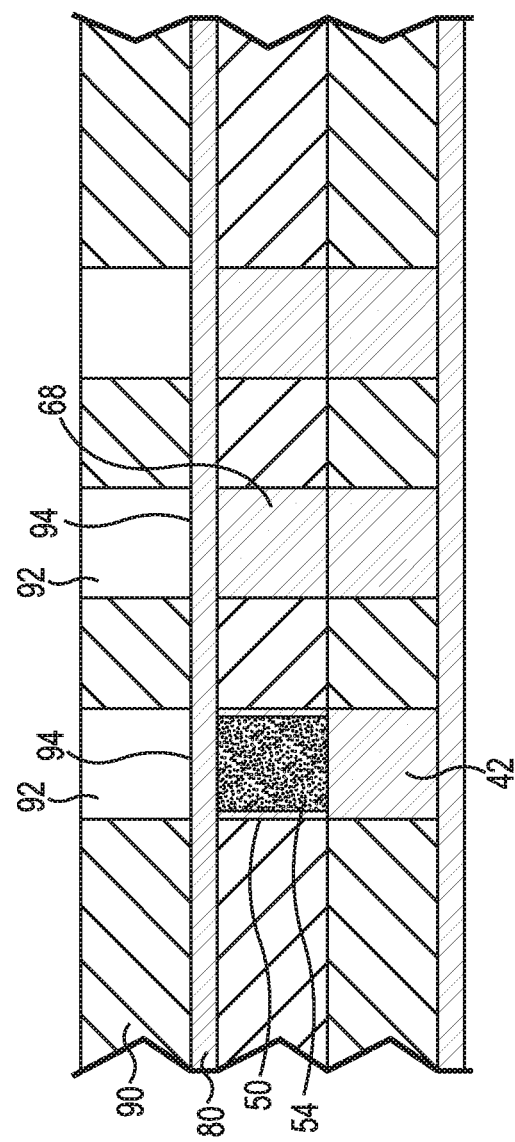

HYBRID PRINTED CIRCUIT ASSEMBLY WITH LOW DENSITY MAIN CORE AND EMBEDDED HIGH DENSITY CIRCUIT REGIONS

CROSS-REFERENCE TO RELATED APPLICATIONS

This application is a continuation of U.S. application Ser. No. 14/408,205, titled HYBRID PRINTED CIRCUIT ASSEMBLY WITH LOW DENSITY MAIN CORE AND EMBEDDED HIGH DENSITY CIRCUIT REGIONS, filed Dec. 15, 2014 (allowed), which claims the benefit of a national stage application under 35 U.S.C. § 371 of International Application No. PCT/US2013/030856, titled HYBRID PRINTED CIRCUIT ASSEMBLY WITH LOW DENSITY MAIN CORE AND EMBEDDED HIGH DENSITY CIRCUIT REGIONS, filed Mar. 13, 2013, which claims priority to U.S. Provisional Application No. 61/669,884, filed Jul. 10, 2012, all of which are hereby incorporated by reference in their entireties.

This application is a continuation-in-part of U.S. patent application Ser. No. 13/320,285, titled COMPLIANT PRINTED FLEXIBLE CIRCUIT, filed Nov. 14, 2011, which is a national stage application under 35 U.S.C. § 371 of International Application No. PCT/US2010/036282, titled COMPLIANT PRINTED FLEXIBLE CIRCUIT, filed May 27, 2010, which claims priority to U.S. Provisional Application No. 61/183,340, filed Jun. 2, 2009, all of which are hereby incorporated by reference in their entireties.

This application is a continuation-in-part of U.S. patent application Ser. No. 13/413,724 (Allowed) entitled Copper Pillar Full Metal Via Electrical Circuit Structure, filed Mar. 7, 2012, which claims the benefit of U.S. Provisional Application No. 61/451,685, filed Mar. 11, 2011, the disclosure of which is hereby incorporated by reference.

This application is a continuation-in-part of U.S. patent application Ser. No. 14/238,638, titled DIRECT METALIZATION OF ELECTRICAL CIRCUIT STRUCTURES, filed Sep. 6, 2012, which claims priority to U.S. Provisional Application No. 61/532,379, filed Sep. 8, 2011, all of which are hereby incorporated by reference in their entireties.

TECHNICAL FIELD

The present disclosure relates to a high density circuit embedded or merged with a lower density circuit, such as a printed circuit board ("PCB"). The present method merges processes used in the printed circuit and semiconductor processing.

BACKGROUND OF THE INVENTION

Traditional printed circuits are often constructed in what is commonly called rigid or flexible formats. The rigid versions are used in nearly every electronic system, where the printed circuit board (PCB) is essentially a laminate of materials and circuits that when built is relatively stiff or rigid and cannot be bent significantly without damage.

Flexible circuits have become very popular in many applications where the ability to bend the circuit to connect one member of a system to another has some benefit. These flexible circuits are made in a very similar fashion as rigid PCB's, where layers of circuitry and dielectric materials are laminated. The main difference is the material set used for construction. Typical flexible circuits start with a polymer film that is clad, laminated, or deposited with copper. A photolithography image with the desired circuitry geometry is printed onto the copper, and the polymer film is etched to remove the unwanted copper. Flexible circuits are very commonly used in many electronic systems such as notebook computers, medical devices, displays, handheld devices, autos, aircraft and many others.

Flexible circuits are processed similar to that of rigid PCB's with a series of imaging, masking, drilling, via creation, plating, and trimming steps. The resulting circuit can be bent, without damaging the copper circuitry. Flexible circuits are solderable, and can have devices attached to provide some desired function. The materials used to make flexible circuits can be used in high frequency applications where the material set and design features can often provide better electrical performance than a comparable rigid circuit.

Flexible circuits are connected to electrical system in a variety of ways. In most cases, a portion of the circuitry is exposed to create a connection point. Once exposed, the circuitry can be connected to another circuit or component by soldering, conductive adhesive, thermo-sonic welding, pressure or a mechanical connector. In general, the terminals are located on an end of the flexible circuit, where edge traces are exposed or in some cases an area array of terminals are exposed. Often there is some sort of mechanical enhancement at or near the connection to prevent the joints from being disconnected during use or flexure.

In general, flexible circuits are expensive compared to some rigid PCB products. Flexible circuits also have some limitations regarding layer count or feature registration, and are therefore generally only used for small or elongated applications.

Rigid PCBs and package substrates experience challenges as the feature sizes and line spacing are reduced to achieve further miniaturization and increased circuit density. The use of laser ablation has become increasingly used to create the via structures for fine line or fine pitch structures. The use of lasers allows localized structure creation, where the processed circuits are plated together to create via connections from one layer to another. As density increases, however, laser processed via structures can experience significant taper, carbon contamination, layer-to-layer shorting during the plating process due to registration issues, and high resistance interconnections that may be prone to result in reliability issues. The challenge of making fine line PCBs often relates to the difficulty in creating very small or blind and buried vias.

The process used by current technology is based upon a dry film process, where a substrate of some sort has a copper layer as the base circuit layer onto which a dry film is applied. The dry film is then patterned with a laser to create the circuit patterns. The next copper layer is added and etched as appropriate, with the laser used to drill through the film to expose the previous copper layer so a via can be plated to join the circuit layers. This process is typically used for semiconductor package substrates and larger format circuit boards, such as used in a cell phone. For larger format circuit boards, the dry film technology is used to build fine line circuits on top of base circuit board made with conventional low density lamination techniques.

In both cases, the package substrate and the larger format circuit board build up are very expensive compared to traditional low density laminate technology, and suffer from several limitations inherent to the process. For example, in the case where a low density laminate base is used as the starting point for subsequent high density layers are built up, the cost increases dramatically since the entire surface of the lower density base board must be processed with the build up process across the entire area, not just in the areas where the high density is required.

Another limitation is the reliability of the via structures joining one circuit layer to another, which tend to be a barrel plated structures with the side walls of the via plated and in many cases must be filled with a via fill material to eliminate an air pocket which may separate during solder reflow temperatures. The vias require drilling through the dry film to expose the previous circuit layer in order to create the via that connects the circuit layers. The dry film is applied as a solid contiguous sheet where the material on that particular layer is restricted to that particular material across the entire layer in the build up less the areas ablated to create the via target for joining the previous and subsequent circuit layers. That is, the dry layer film is homogeneous across the entire layer.

BRIEF SUMMARY OF THE INVENTION

The present disclosure relates to a high density localized circuit region embedded or merged with a lower density circuit, such as a PCB, flexible circuit, or the like. The present method merges processes used in the printed circuit and semiconductor packaging industries that will enable next generation electrical performance. By combining methods used in the PCB and flexible circuit fabrication and semiconductor packaging industries, the present disclosure enables fine line high density circuit structures with attractive cost of manufacture.

The present disclosure permits bulk conductive material to be added to create a very small low resistance vias to increase density and reduce line and feature pitch of the high density circuit. The printed circuit can be produced to replicate a traditional circuit, or it can be an interconnect to one or more members of a system embedded or incorporated. In basic terms, the structure leverages methods used in the semiconductor packaging industry such as pillar termination to act as the via connecting layers within the circuit stack. In addition, the high density circuit can be treated as a system of its own by incorporating printed transistors or other passive and active function.

As noted above, printed circuit fabrication methods have advanced in recent years due to the adoption of high performance smart phones and tablet computers. These small form factor circuit boards are often made with what is called a High Density Interconnect ("HDI") or Build Up process, where the main substrate has the lower density regions and the higher density regions are built up onto the lower density core. This process employs a dry film with laser drilled vias within the build-up areas to create the layer to layer interconnect.

The present disclosure also provides a high density circuit structure embedded or merged with a lower density main PCB produced with a low cost conventional fabrication method. The present fabrication process includes depositing a liquid dielectric material onto a high density substrate, patterning the dielectric material to create desired features and via locations, processing the dielectric material to create a surface that will accept electro-less copper deposition, directly metalizing, etching to create circuit patterns, copper flash or electro-deposit plating to build up thicker copper structures etc., with steps repeated to create multiple layers.

The merger of the high density circuit structure to the lower density circuit is typically accomplished by targeting copper terminal points in the lower density circuit that are plated together with corresponding locations within the high density circuit. The final assembly is optionally coated with final mask that essentially provides the appearance of a contiguous construction.

In one embodiment, a high density coupon which appears similar in nature to a semiconductor package substrate is mated with corresponding terminal locations within the low density circuit and plated or thermal compression bonded together. The high density circuit can also be formed in situ directly on the low density circuit.

The present disclosure includes electro-less plating surfaces of recesses in dielectric layers to create conductive structures, such as vias. The plated recesses are then filled with a conductive material using electroplating techniques. The resulting structure is a very small low resistance vias that permits increased density and reduced line and feature pitch The present high performance electrical circuit can be treated as a system of its own by incorporating electrical devices or other passive and active function, such as for example, ground planes, power planes, electrical connections to other circuit members, dielectric layers, conductive traces, transistors, capacitors, resistors, RF antennae, shielding, filters, signal or power altering and enhancing devices, memory devices, embedded IC, and the like. In some embodiments, the electrical devices can be formed using printing technology, adding intelligence to the circuit assembly.

The liquid dielectric can be processed to create vias and associated circuit geometry having a variety of shapes and sizes, depending on the terminal structure on the circuit members. The contact members and vias can be positioned at a variety of locations, heights, or spacing to match the parameters of existing connections making it easy to replace an existing circuit without changing hardware or the low density circuit. The present disclosure permits the creation of blind or buried conductive structures on very tight pitch of about 25 microns or below without the use of laser ablation.

Traditional PCB and flex circuit fabrication methods take sheets of material and stack them up, laminate, and/or drill. The materials in each layer are limited to the materials in a particular sheet. The present disclosure employs a mix of additive and subtractive technologies to permit a wide variety of materials to be applied on a single layer with a registration relative to the features of the previous layer. Selective addition of conductive, non-conductive, or semi-conductive materials at precise locations to create a desired effect has the major advantages in tuning impedance or adding electrical function on a given layer. Tuning performance on a layer by layer basis relative to the previous layer greatly enhances electrical performance.

The present disclosure is directed to a high density region for a low density circuit. At least a first liquid dielectric layer is deposited on the first surface of a first circuitry layer imaged to create a plurality of first recesses. Surfaces of the first recesses are plated electro-lessly with a conductive material to create a first conductive structure electrically coupled to, and extending generally perpendicular to, the first circuitry layer. A conductive material is electro-plated to the first conductive structure to substantially fill the first recesses. At least a second liquid dielectric layer is deposited on the first dielectric layer to include a plurality of second recesses imaged to generally align with a plurality of the first conductive structures. Surfaces of the second recesses are plated electro-lessly with a conductive material create second conductive structures electrically coupled to, and extending generally perpendicular to, the first conductive structures. A conductive material is electro-plated to the second conductive structures to substantially fill the second recesses.

In one embodiment, an IC device is electrically coupled to the plating in a plurality of the second recesses.

The high density region can include a second circuitry layer located on the second dielectric layer and electrically coupled with a plurality of the second conductive structures. A third dielectric layer is optionally deposited on the second dielectric layer imaged to include a plurality of third recesses generally aligned with a plurality of the second conductive structures.

The high density region can include a conductive material plated on surfaces of a plurality of the third recesses to create a third conductive structure electrically coupled to, and extending parallel to the second conductive structures. A conductive material is electro-plated to the third conductive structures to substantially fill the third recesses. An IC device including a plurality of contact pads is electrically coupled to a plurality of the third conductive structures, wherein the IC device is electrically coupled by one of a flip chip attachment directly to a plurality of third conductive structures, solder balls, or wire bonding.

The high density circuit can be constructed on the low density circuit or as a separate structure that is later merged with the low density circuit. In one embodiment, the first circuitry layer is formed on the low density circuit and the high density circuit is formed on the first circuitry layer.

BRIEF DESCRIPTION OF THE SEVERAL VIEWS OF THE DRAWING

FIGS. 1A and 1B are top and side views of a plurality of high density circuit structures combined with a low density PCB in accordance with an embodiment of the present disclosure.

FIG. 1C is a side view of the PCB merged with the high density circuit structures in accordance with an embodiment of the present disclosure.

FIG. 3 illustrates an optional additional layer on the high density electrical circuit of FIG. 1 in accordance with an embodiment of the present disclosure.

FIG. 4 illustrates application to a second circuitry layer to the high density electrical circuit of FIG. 1 in accordance with an embodiment of the present disclosure.

FIG. 5 illustrates an optional dielectric layer on the high density electrical circuit of FIG. 1 in accordance with an embodiment of the present disclosure.

DETAILED DESCRIPTION OF THE INVENTION

Figure 2A:
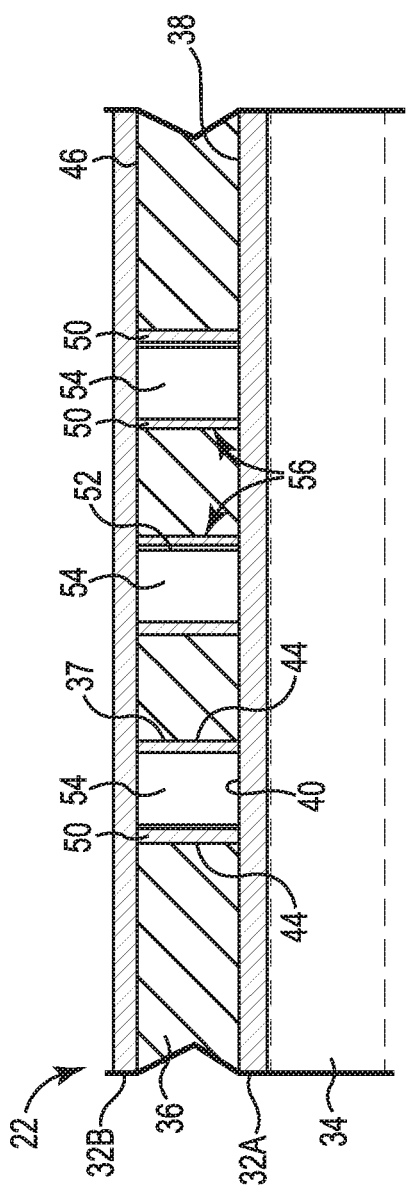
FIG. 2A is a cross-sectional view of a method of making a high density circuit structure in accordance with an embodiment of the present disclosure.

A high density circuit structure according to the present disclosure may permit fine contact-to-contact spacing (pitch) on the order of less than 1.0 mm pitch, and more preferably a pitch of less than about 0.7 millimeter, and most preferably a pitch of less than about 0.4 millimeter. Such fine pitch high density circuit structures are especially useful for communications, wireless, and memory devices.

The present high density circuit structure can be configured as a low cost, high signal performance electrical interconnect assembly, which has a low profile that is particularly useful for desktop and mobile PC applications. IC devices can be installed and uninstalled without the need to reflow solder. The solder-free electrical connection of the IC devices is environmentally friendly. In another embodiment, the high density circuit structure can also be a portion of a socket or semiconductor package.

FIGS. 1A and 1B schematically illustrate the merger of a lower density circuit 20 with one or more high density circuits 22A, 22B, 22C, 22D ("22") into the contiguous assembly of FIG. 1C. The lower density circuit 20 may be a printed circuit board, a flexible circuit, or the like. The high density circuit 22 can be a printed circuit board, an IC socket, a semiconductor package, or the like.

Dielectric material 24 is optionally applied to the surface 26 of the low density circuit 20 so the location of the high density circuits 22 is at least partially defined and isolated. The dielectric material 24 may be a film or a liquid dielectric. The dielectric material 24 is imaged to expose the circuit locations 28 for the high density circuits 22, improving alignment of vias on the lower density main core 20 with the high density circuits 22.

As will be discussed in more detail below, the dielectric 24 is optionally processed to enable electro-less or electrolytic copper plating to adhere to the surface of the dielectric and grow a thick trace or pillar or via structure within the imaged region with undesired areas remaining un-plated or post plate etched to remove unwanted copper. Once the surfaces are plated, a higher deposition rate electroplate copper can be applied to build up the thickness or area of copper as desired.

If the circuit assembly 30 is a flexible circuit, the base layer can be a material such as polyimide or liquid crystal polymer. If the circuit assembly 30 is a rigid circuit board, the base can be FR4 or one of many high speed laminates or substrates. If the circuit assembly 30 is a semiconductor package, the base can be a material such as FR4, BT resin of any one of a variety of laminate or substrate materials. If the circuit assembly 30 is an electrical connector or socket, the base can be molded LCP, machined plastic, or a variety of films or substrate materials.

The high density circuits 22 (also referred to as "coupons") can be made using conventional build up technology described above or using the process described below. The high density circuits 22 are then merged with the low density circuit 20. In another embodiment, the high density circuits 22 can be fabricated in-situ directly on the low density circuit 20 using the processes described herein. The present method permits the high density circuits 22 to be formed directly in the circuit locations 28, without having to extend the processing across the entire low density circuit 20.

FIG. 2A is a side cross-sectional view of a method of making the high density electrical circuits 22 in accordance with an embodiment of the present disclosure. The first step is to start with base material of some sort, such as a copper foil 32A or a core 34 of some sort to act as a support member. If the starting base is copper foil 32A, then the foil can act as the first layer circuitry or escape layer which would be the layer to be merged with the circuit locations 28 on the low density circuit 20. In the case where the high density circuit 22 is a semiconductor package, the foil 32A can be the termination points for BGA attachment to the low density circuit 20. The base 34 can also be a sacrificial member that is removed at some point later in the process to reveal the individual coupons 22.

In the illustrated embodiment, copper foil circuitry layer 32A is located on reinforcing layer 34. The layer 34 can be a traditional PCB or laminated to a stiffening layer or core, such as glass-reinforced epoxy laminate sheets (e.g., FR4). The circuitry layer 32A can be preformed or can be formed using a fine line imaging step is conducted to etch copper foil as done with many PCB processes.

Liquid dielectric material 36 is applied to surface 38 and flows between the regions of the circuitry 32A. A dry dielectric film, by contrast, does not flow into the recessed regions. The dielectric layer 36 can be tack cured to partially link the polymer and allow for handling, while retaining the ability to image the material in a photolithography process. Alternatively, the dielectric layer 36 can be processed with a laser direct imaging process known as LDI.

The dielectric material 36 is typically imaged to create recesses 37 that expose the desired locations 40 on circuitry layer 32A with theoretical via locations 37 created as part of the image directly in proximity to the circuitry layer 32A. One benefit of imaging the dielectric layer 36 is that the via structures do not need to be round as with traditional drilled vias. Any shape that can be imaged and will result in a grown full metal via 54 of the desired shape.

The dielectric surface 46 can be planarized to create a very consistent dielectric thickness and planarity, as well as assist with preparing select surfaces for electro-less copper plating adhesion. Planarization also permits as many layers to be added to the circuit 22 as needed.

The dielectric layer 36 is preferably processed to promote electro-less copper plating using one or more of plasma treatment, permanganate, carbon treatment, impregnating copper nano-particles to activate the desired surfaces to promote electroplating. In the illustrated embodiment, the dielectric material 36 is processed to promote plating adhesion to the side walls 44 of the recesses 37. Electro-less copper plating is applied to the side walls 44 of the recesses 37 to create conductive structures 50, resulting in a three-dimensional landscape. Additional discussion of the use of electro-less plating of the dielectric structure is disclosed in PCT/US2012/53848, filed Sep. 6, 2012, entitled DIRECT METALIZATION OF ELECTRICAL CIRCUIT STRUCTURES, the entire of disclosure of which is hereby incorporated by reference.

A plating resist is applied, imaged and developed to expose the via location 37 and previous circuit layer 32A. In the illustrated embodiment, the conductive structure 50 is an annular-shaped via electrically coupled to the circuitry layer 32A with a center opening or recess 52. Once the surfaces 44 of the dielectric material 36 are plated, a higher deposition rate electroplate copper can be used to fill the recess 52 with conductive material 54 to form a conductive pillar 56. The plating resist is stripped and the copper deposition 50, 54 is optionally planarized. The resulting conductive pillars 56 include a shell 50 of electro-less conductive material and a core 54 of electro-plated conductive material.

A present process creates the ability to stack full metal vias 54 in subsequent deposition steps to create a high aspect ratio via without the need to drill through the entire stack 22 in one operation. Another benefit is the ability to provide a mounting point for a packaged semiconductor device where a copper pillars 54 are created as an alternative to conventional via in pad construction which can be plagued with reliability issues and high costs to manufacture.

In another embodiment, the present process enhances the electroplating process is to deposit electro-less copper or copper flash to provide a bus structure for bulk copper electro plating. The copper bus structure is subsequently removed with a differential etch process that leaves bulk copper 54 intact. An alternate step can be employed to add multiple layers of resist 36 and continue the copper growth procedure if desired, with the resulting structures encapsulated by the next dielectric application.

The shape of the conductive structures 50, 54 is dictated by the shape of the recesses 37. A square recess 37 results in a square-shaped conductive structure 54. The plating process can be controlled to a certain degree, but in some cases with fine pitch geometries and high speed circuits, upper surfaces 46 of the dielectric 36 and the conductive structure 54 may vary in topography or height relative to the field, and the dielectric material 36 may vary in thickness slightly especially if liquid material is used. Consequently, it is preferred to planarize to surfaces 46 of the conductive structures 54 and the exposed surface 46 of the dielectric 36 between steps to control thickness and flatness of the electrical circuit 22.

In the illustrated embodiment, additional foil layer 32B is applied and processed to create a circuit structure using any of the techniques discussed herein. The conductive material 54 electrically couples the circuit layer 32A to the circuit layer 32B.

The present method permits the material between layers and within each layer to be varied. One aspect of the present process that differs from the traditional dry film build up process is the nature of the dielectric deposition in liquid form. The dielectric layer 36 can be applied by screen printing, stencil printing, jetting, flooding, spraying etc. The liquid material 36 flows and fills any recessed regions within a previous circuit landscape 32A. During the development process, desired regions remain and the regions that are not desired are washed away with fine resolution of the transition regions within the landscape. Multiple depositions steps can be tack cured and imaged such that thicker sections of dielectric 36 can be developed and washed away in one or multiple strip operations. As a result, internal cavities or mass regions can be excavated and subsequently filled at the next dielectric layer with materials that have physical properties differing from the base dielectric 36. In other words, the excavated regions can be filled or treated with materials that have a different dielectric constant, vary in conductive or mechanical or thermal properties to achieve a desired performance function not possible with a contiguous dry film technique. In basic terms, the present process not only provides the ability to alter the material set and associated properties in a given layer, but the material set can be altered at any given point within a given deposition or layer.

The present process can also be used in combination with existing dry film techniques. For example, one or more of the layers can be a preformed dielectric film to leave air dielectric gaps between traces. Recesses 37 in the dielectric layer 36 that expose circuitry 32A can be formed by printing, embossing, imprinting, laser cutting, chemical etching with a printed mask, or a variety of other techniques.

Figure 2B:
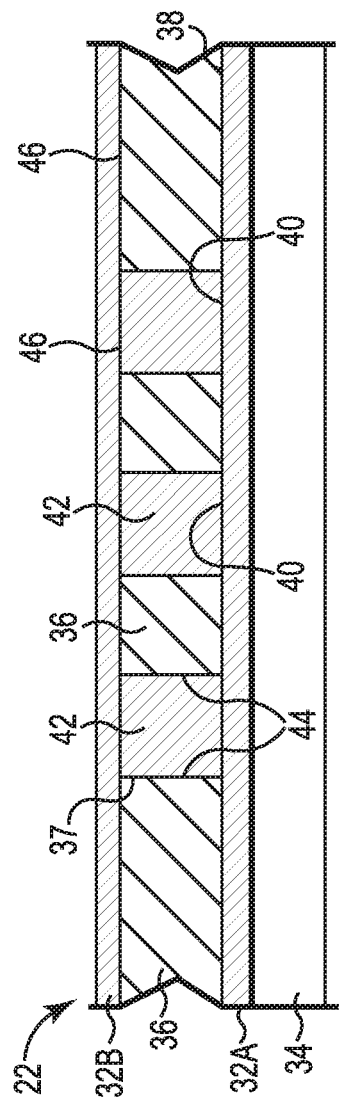
FIG. 2B is a cross-sectional view of an alternate method of making a high density circuit structure in accordance with an embodiment of the present disclosure.

FIG. 2B illustrates an alternate high density electrical circuit 22 in accordance with an embodiment of the present disclosure. The process is the same as discussed in connection with FIG. 2A, except that the sidewalls 44 of the dielectric material 36 are not processed to receive electro-less plating. Rather, a bulk conductive material 42 is applied directly to exposed portions 40 of the circuit layer 32A. The surface 46 is preferably planarized and the circuit layer 32B is applied using any of the techniques disclosed herein.

FIG. 3 illustrates higher aspect ratio conductive pillar 60 formed on the high density electrical circuit 22 without the foil layer 32B. The process discussed above is repeated by applying another layer 62 of dielectric 36 that is imaged to created recesses 64 that expose the upper surface 66 of the copper pillar 42. The upper surfaces 66 of the copper pillars 42 are then plated as discussed above to create conductive extension 68 of the copper pillar 42.

In one embodiment, the conductive extensions 68 are planarized to permit die attach point 70 to facilitate flip chip attach of the die 72 to the conductive extensions 68 directly. In another embodiment, exposed surfaces 74 of the plating can be enlarged to facilitate soldering of the die 72 to the conductive extensions 68.

FIG. 4 illustrates circuitry layer 80 is applied to the top surface 78 of the electrical circuit 22 and coupled to the conductive extensions 68. The circuitry layer 80 creates the base for additional routing layers and to facilitate vertical connection to subsequent layers in the stack in accordance with an alternate embodiment of the present disclosure.

FIG. 5 illustrates dielectric layer 90 added to the subsequent circuitry layer 80 in accordance with an alternate embodiment of the present disclosure. The dielectric layer 90 is imaged to create recesses 92 that expose portions 94 of the circuitry layer 80 that corresponds with the via extensions 68. The dielectric layer 90 protects the portions of the circuitry layers 80 that are not to be etched and provides access to the foil intimate to the conductive structures 42 and 68. In one embodiment, the extension 68 is optionally conductive structure 50 with a core 54 of conductive or non-conductive material.

Figure 6:
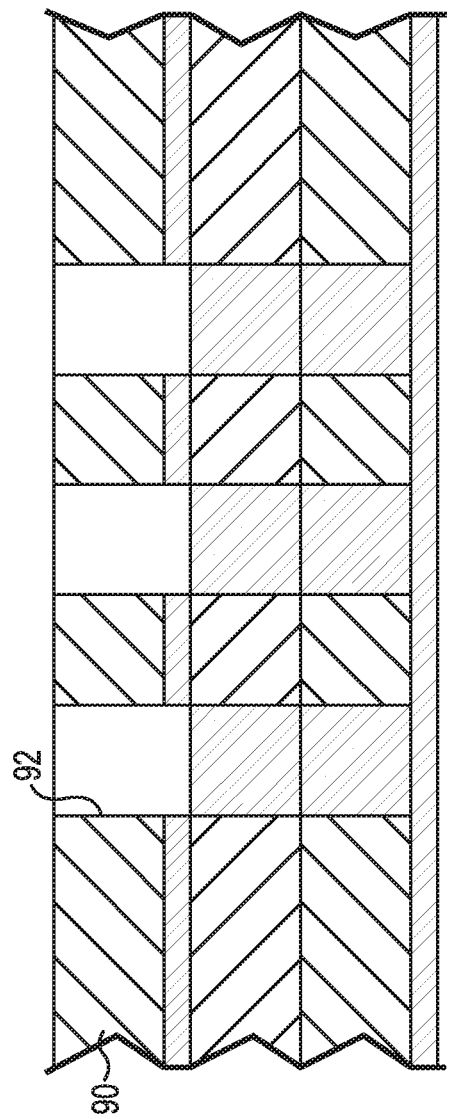
FIG. 6 illustrates an optional etching step on the high density electrical circuit of FIG. 1 in accordance with an embodiment of the present disclosure.

FIG. 6 illustrates a subsequent etch process that removes the copper foil 94 (see FIG. 5) located in the recesses 92 to allow access for the next plating step to join the layers together in accordance with an alternate embodiment of the present disclosure.

Depending on the dielectric material 90 and desired final construction, the resist layer 90 can be stripped to provide a level to be planarized as the base of further processing or the resist layer 90 can be left in place provided it is of the proper material type. The exposed regions that provided access for etch and plating can be filled with similar material to seal the layer which can be planarized for further processing if desired.

Figure 7:
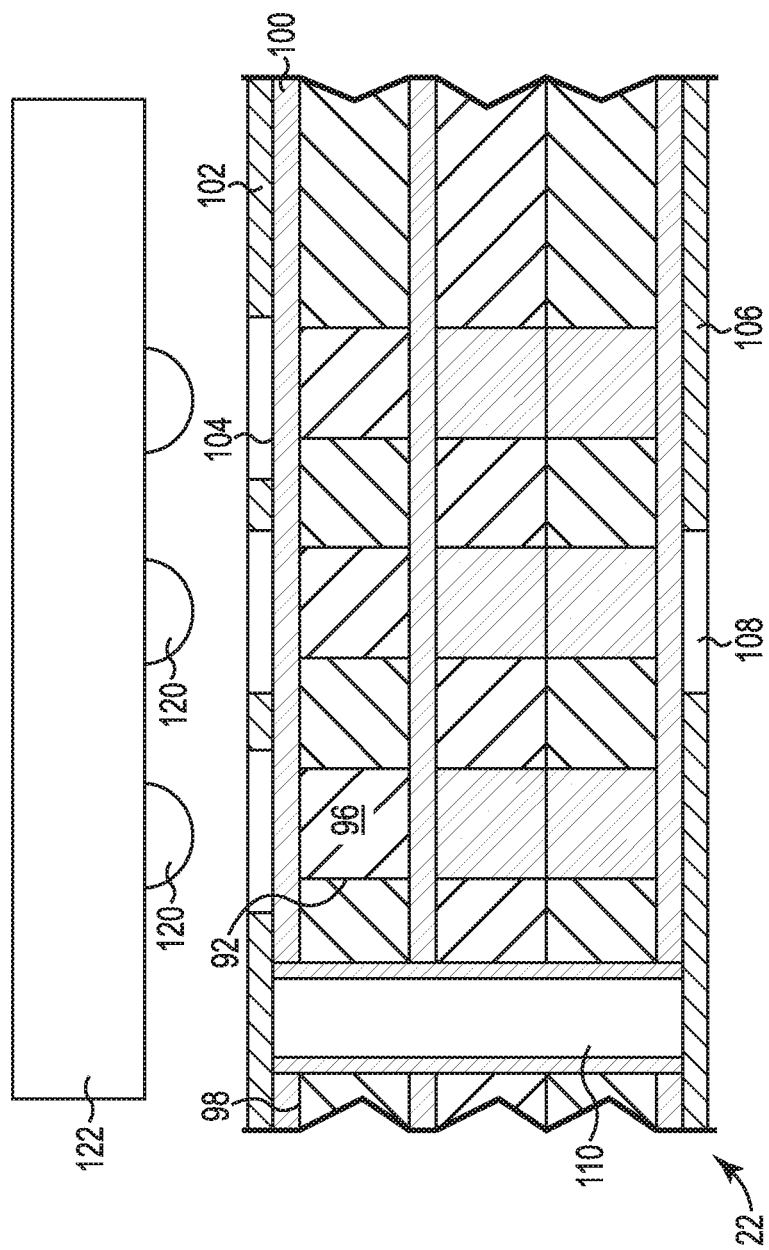
FIG. 7 illustrates an electrical interconnect interfaced with a BGA device in accordance with an embodiment of the present disclosure.

FIG. 7 illustrates one possible variation of the electrical circuit 22. Recesses 92 are filled with a dielectric material 96 and the surface 98 is planarized to receive circuitry plane 100. Dielectric layer 102 is deposited on the circuitry plane 100 to expose selective regions 104. The selective regions 104 are configured to correspond to solder balls 120 on BGA device 122. In the illustrated embodiment, bottom dielectric layer 106 is optionally deposited on circuitry layer 52 in a manner to expose selective regions 108.

In one embodiment, the electrical circuit 22 is further processed with conventional circuit fabrication processes to create larger diameter through vias or through holes plated 110 as needed, solder mask applied and imaged to expose device termination locations 104, 108, laser direct imaging, legend application etc. In another embodiment, the via 110 is formed using electro-less plating of each layer of the stack, as illustrated in FIG. 6.

Figure 8:
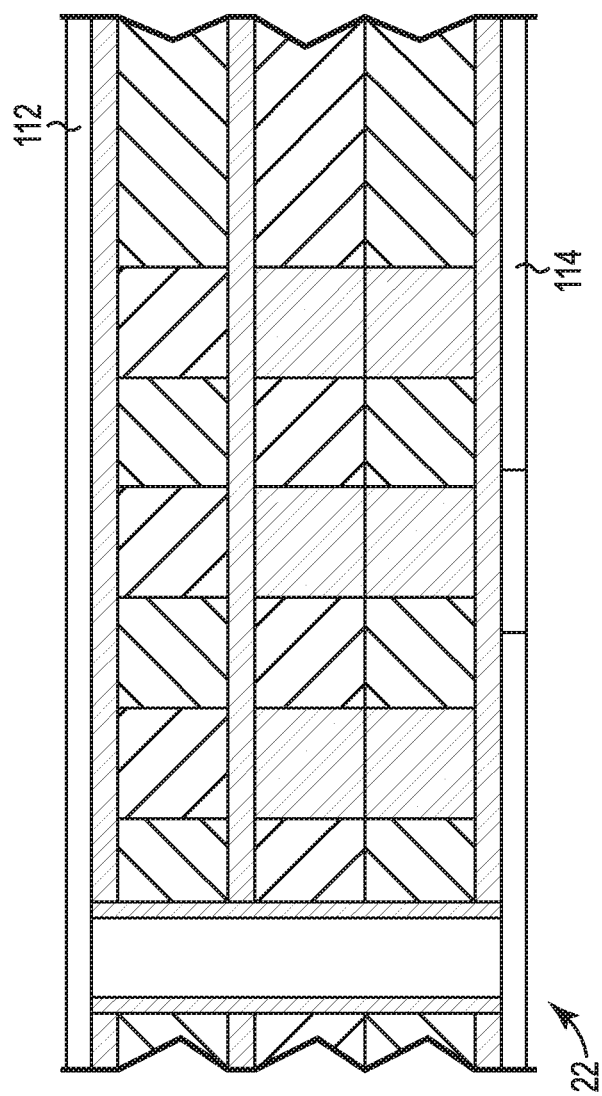
FIG. 8 illustrates an electrical interconnect for a flexible circuit in accordance with an embodiment of the present disclosure.

FIG. 8 illustrate an alternate embodiment in which the electrical circuit 22 is used in a flexible circuit applications. The electrical circuit 22 is laminated with ground planes and cover layers 112, 114. In some applications the insulating layers 112, 114 are applied by jet printing of polyimide or liquid crystal polymers (LCP) inks as a final layer or as a combination of laminated film and jetted material.

Figure 9:
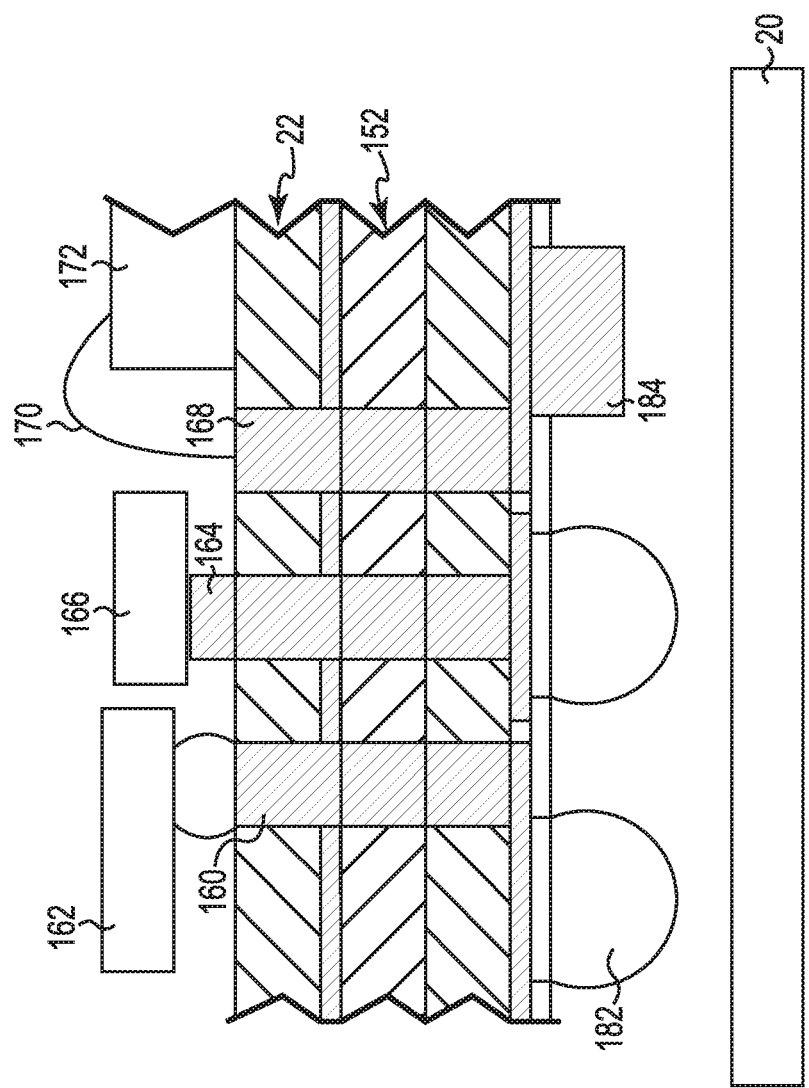
FIG. 9 illustrates an electrical interconnect for an IC package in accordance with an embodiment of the present disclosure.

FIG. 9 illustrates an electrical circuit 22 for semiconductor packaging applications in accordance with an embodiment of the present disclosure. The stack 152 can be final processed with a variety of options to facilitate electrical connections to IC devices 162, 166, 172 and to system level attachment to low density circuit 20.

In one embodiment, the plating 160 is planarized to facilitate flip chip attach to the structure directly (see e.g., FIG. 2) or to receive BGA device 162. In other embodiment, plating 164 is extended to facilitate direct soldering of IC device die 166 with paste. In yet another embodiment, plating 168 is wire bonded 170 to the IC device 172.

The low density main core 20 can be processed to accept a traditional ball grid array attachment 182 for an area array configuration or plated with solder/tin etc. for a no lead peripheral termination. The low density main core 20 can also be fashioned to have plating or post extensions 184 to facilitate direct solder attach with paste and provide a natural standoff from the low density circuit 20.

Figure 10:
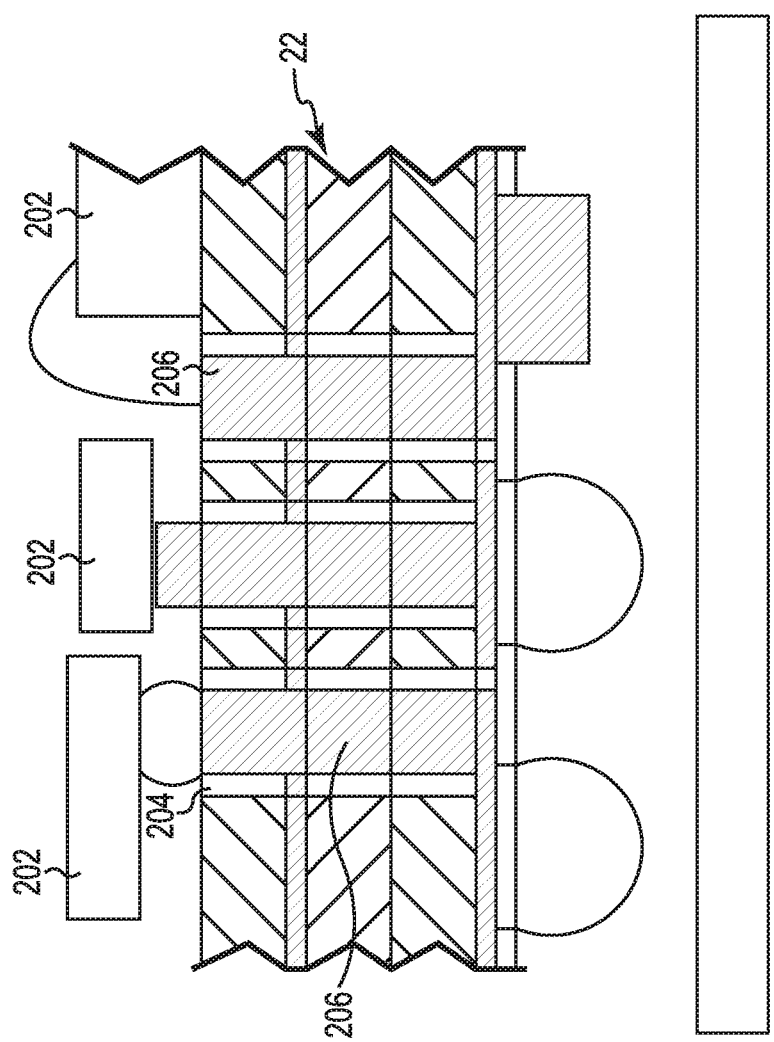
FIG. 10 illustrates an alternate electrical circuit for an IC package in accordance with an embodiment of the present disclosure.

FIG. 10 illustrates an electrical circuit 22 for a semiconductor packages 202 with dielectric materials 204 surrounding the conductive structures 206 in accordance with an embodiment of the present disclosure. Internal circuits and terminations may also be added by imaging or drilling the core material with a larger opening than needed and filling those openings with dielectric and imaging the desired geometry to facilitate conductive structure formation.

Figure 11:
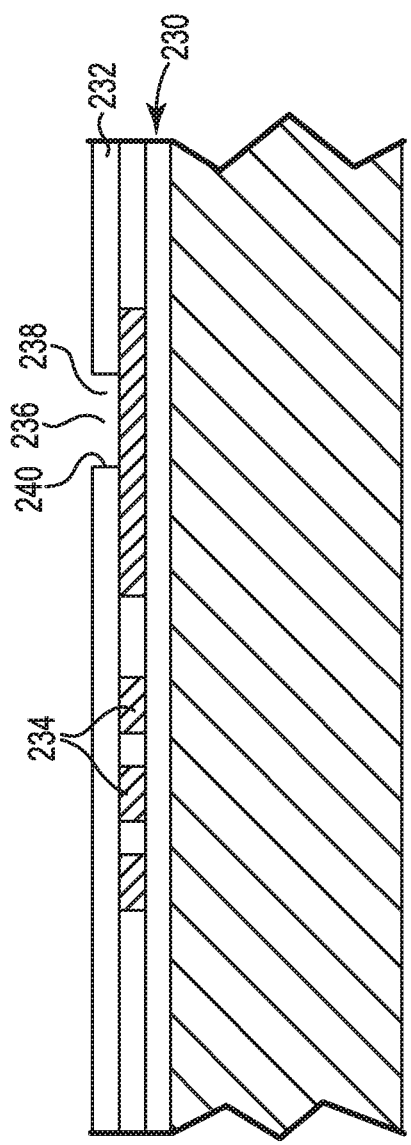
FIG. 11 is a side sectional view of an electrical circuit in accordance with an embodiment of the present disclosure.

FIG. 11 illustrates an alternate electrical circuit 230 with an insulating layer 232 applied to the circuit geometry 234. The nature of the liquid dielectric application process allows for selective application of dielectric layer 232 to leave selected portions 236 of the circuit geometry 234 expose if desired. The resulting high density electrical circuit 230 can potentially be considered entirely "green" with limited or no chemistry used to produce beyond the direct write materials.

The dielectric layers of the present disclosure may be constructed of any of a number of dielectric materials that are currently used to make sockets, semiconductor packaging, and printed circuit boards. Examples may include UV stabilized tetrafunctional epoxy resin systems referred to as Flame Retardant 4 (FR-4); bismaleimide-triazine thermoset epoxy resins referred to as BT-Epoxy or BT Resin; and liquid crystal polymers (LCPs), which are polyester polymers that are extremely unreactive, inert and resistant to fire. Other suitable plastics include phenolics, polyesters, and Ryton® available from Phillips Petroleum Company.

In one embodiment, one or more of the dielectric materials are designed to provide electrostatic dissipation or to reduce cross-talk between the traces of the circuit geometry. An efficient way to prevent electrostatic discharge ("ESD") is to construct one of the layers from materials that are not too conductive but that will slowly conduct static charges away. These materials preferably have resistivity values in the range of $10^5$ to $10^{11}$ Ohm-meters.

Figure 12:
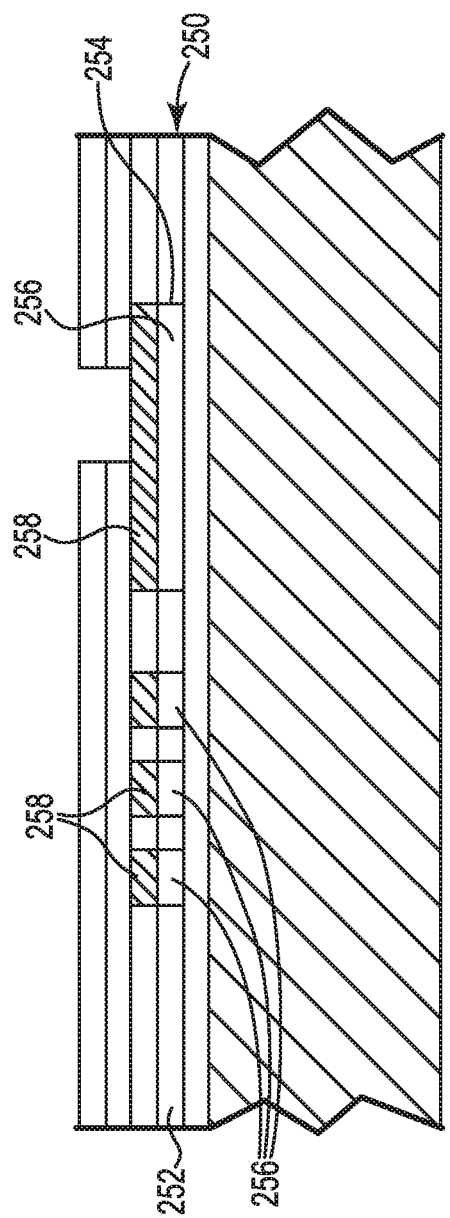
FIG. 12 is a side sectional view of an alternate electrical circuit with printed compliant material in accordance with an embodiment of the present disclosure.

FIG. 12 illustrates an alternate high density electrical circuit 250 in accordance with an embodiment of the present disclosure. Dielectric layer 252 includes openings 254 into which compliant material 256 is deposited or printed before formation of circuit geometry 258. The compliant material 256 improves reliability during flexure of the electrical circuit 250.

Figure 13:
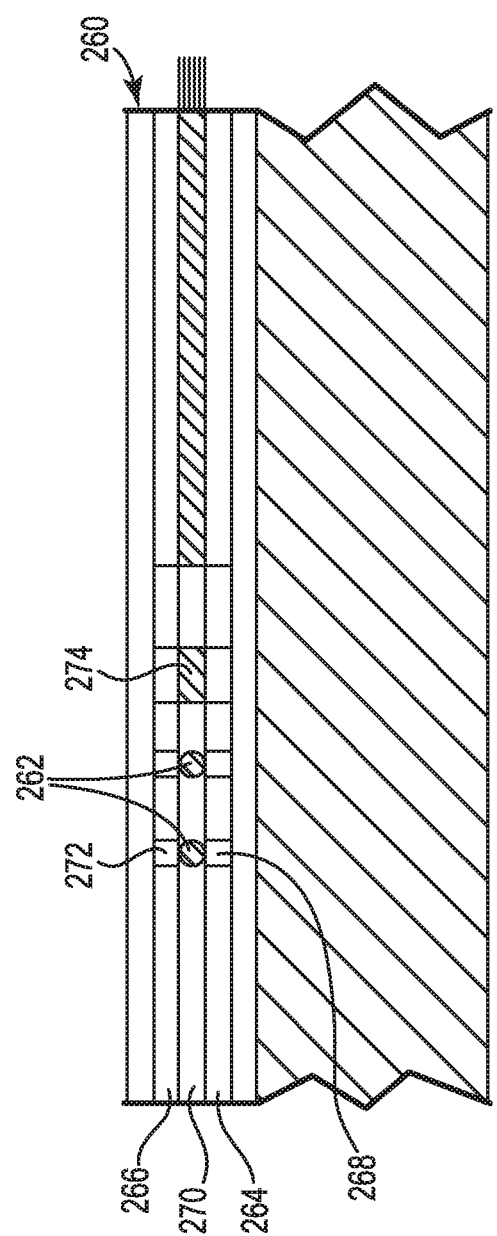
FIG. 13 illustrates an electrical circuit with optical features in accordance with an embodiment of the present disclosure.

FIG. 13 illustrates an alternate high performance electrical circuit 260 in accordance with an embodiment of the present disclosure. Optical fibers 262 are located between layers 264, 266 of dielectric material. In one embodiment, optical fibers 262 are positioned over compliant layer 268, and dielectric layer 270 is formed over and around the optical fibers 262. A compliant layer 272 is preferably provided above the optical fiber 262 as well. The compliant layers 268, 272 support the optical fibers 262 during flexure. In another embodiment, the dielectric layer 270 is imaged with recesses into which the optical fibers 262 are deposited.

In another embodiment, optical quality materials 274 are printed during assembly of the high density electrical circuit 260. The optical quality material 274 and/or the optical fibers 262 comprise optical circuit geometries. The printing process allows for deposition of coatings in-situ that enhances the optical transmission or reduces loss. The precision of the printing process reduces misalignment issues when the optical materials 274 are optically coupled with another optical structure.

Figure 14:
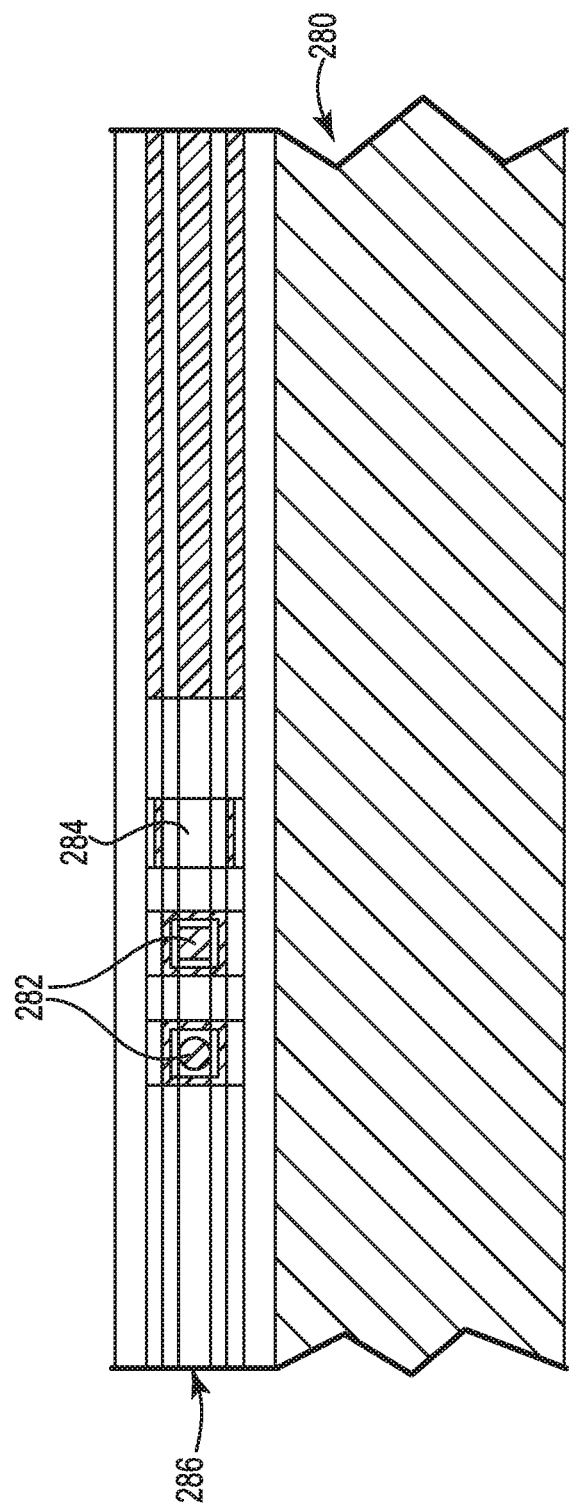
FIG. 14 illustrates an alternate high density electrical circuit with optical features in accordance with an embodiment of the present disclosure.

FIG. 14 illustrates another embodiment of a present high density electrical circuit 280 in accordance with an embodiment of the present disclosure. Embedded coaxial RF circuits 282 or printed micro strip RF circuits 284 are located within the dielectric layers 286. These RF circuits 282, 284 are preferably created by printing dielectrics and metallization geometry.

Figure 15:
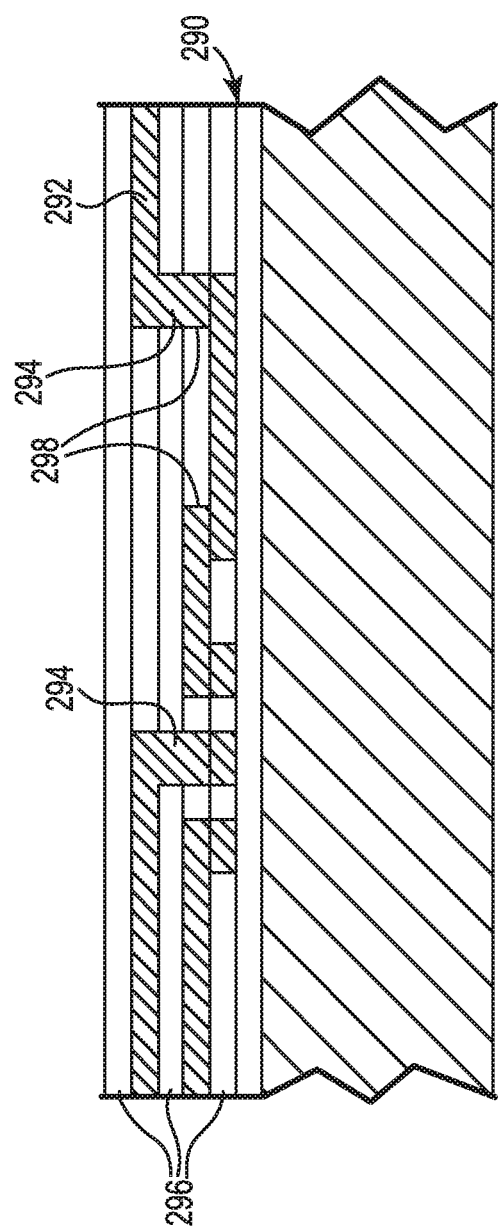
FIG. 15 illustrates an alternate high density circuit structure with printed vias in accordance with an embodiment of the present disclosure.

As illustrated in FIG. 15, use of the present process allows the creation of a high density electrical circuit 290 with inter-circuit, 3D lattice structures 292 having intricate routing schemes. Conductive pillars 294 can be plated with each layer, without drilling.

The nature of the present process permit controlled application of dielectric layers 296 creates recesses 298 that control the location, cross section, material content, and aspect ratio of the conductive traces 292 and the conductive pillars 294. Maintaining the conductive traces 292 and conductive pillars 294 with a cross-section of 1:1 or greater provides greater signal integrity than traditional subtractive trace forming technologies. For example, traditional methods take a sheet of a given thickness and etches the material between the traces away to have a resultant trace that is usually wider than it is thick. The etching process also removes more material at the top surface of the trace than at the bottom, leaving a trace with a trapezoidal cross-sectional shape, degrading signal integrity in some applications.

Using the imaged recesses 298 to control the aspect ratio of the conductive traces 292 and the conductive pillars 294 results in a more rectangular or square cross-section, with the corresponding improvement in signal integrity. The recesses 298 are preferably processed to receive electro-less plating, followed by electroplating to build up the conductive traces 292.

In another embodiment, pre-patterned or pre-etched thin conductive foil circuit traces are transferred to the recesses 298. For example, a pressure sensitive adhesive can be used to retain the copper foil circuit traces in the recesses 298. The trapezoidal cross-sections of the preformed conductive foil traces are then post-plated. The plating material fills the open spaces in the recesses 298 not occupied by the foil circuit geometry, resulting in a substantially rectangular or square cross-sectional shape corresponding to the shape of the recesses 298.

In another embodiment, a thin conductive foil is pressed into the recesses 298, and the edges of the recesses 298 acts to cut or shear the conductive foil. The process locates a portion of the conductive foil in the recesses 298, but leaves the negative pattern of the conductive foil not wanted outside and above the recesses 298 for easy removal. Again, the foil in the recesses 298 is preferably post plated to add material to increase the thickness of the conductive traces 292 in the circuit geometry and to fill any voids left between the conductive foil and the recesses 298.

Figure 16:
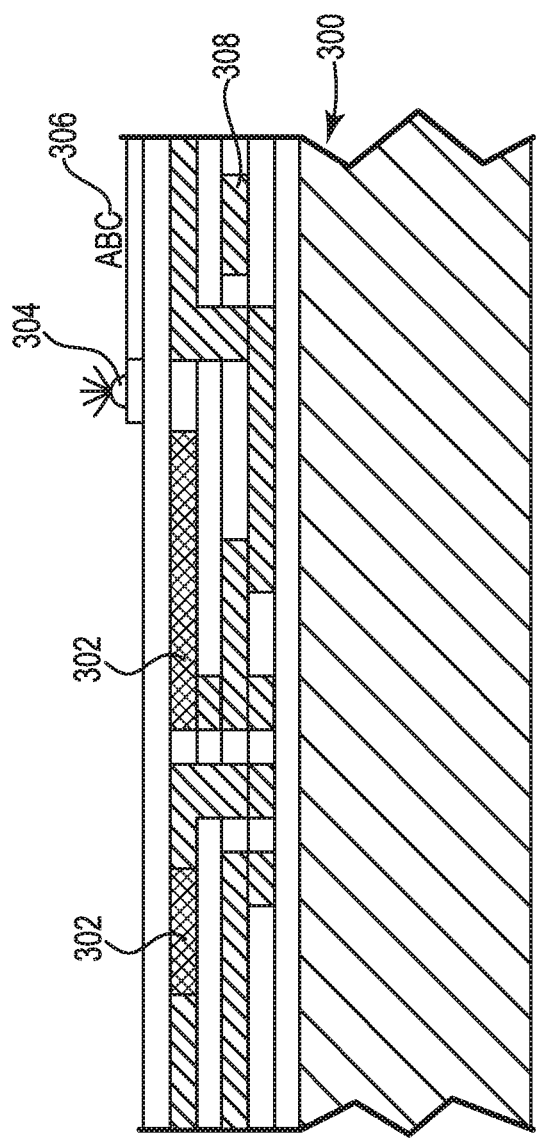
FIG. 16 illustrates an alternate high density circuit structure with printed electrical devices in accordance with an embodiment of the present disclosure.

FIG. 16 illustrates a high density electrical circuit 300 with printed electrical devices 302. The electrical devices 302 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like. In the illustrated embodiment, electrical devices 302 include printed LED indicator 304 and display electronics 306. Geometries can also be printed to provide capacitive coupling 308. Compliant material can be added between circuit geometry, such as discussed above, so the present electrical circuit can be plugged into a receptacle or socket, supplementing or replacing the need for compliance within the connector.

The electrical devices 302 are preferably printed during construction of the circuit assembly 300. The electrical devices 302 can be ground planes, power planes, electrical connections to other circuit members, dielectric layers, conductive traces, transistors, capacitors, resistors, RF antennae, shielding, filters, signal or power altering and enhancing devices, memory devices, embedded IC, and the like. For example, the electrical devices 302 can be formed using printing technology, adding intelligence to the high performance electrical circuit 300. Features that are typically located on other circuit members can be incorporated into the circuit 300 in accordance with an embodiment of the present disclosure.

The availability of printable silicon inks provides the ability to print electrical devices 302, such as disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. In particular, U.S. Pat. No. 6,506,438 (Duthaler et al.) and U.S. Pat. No. 6,750,473 (Amundson et al.), which are incorporated by reference, teach using ink-jet printing to make various electrical devices, such as, resistors, capacitors, diodes, inductors (or elements which may be used in radio applications or magnetic or electric field transmission of power or data), semiconductor logic elements, electrooptical elements, transistor (including, light emitting, light sensing or solar cell elements, field effect transistor, top gate structures), and the like.

The electrical devices 302 can also be created by aerosol printing, such as disclosed in U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference.

Printing processes are preferably used to fabricate various functional structures, such as conductive paths and electrical devices, without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

Ink jet printing of electronically active inks can be done on a large class of substrates, without the requirements of standard vacuum processing or etching. The inks may incorporate mechanical, electrical or other properties, such as, conducting, insulating, resistive, magnetic, semi conductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or Teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from DuPont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinyldenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181, which is incorporated herein by reference.

A protective layer can optionally be printed onto the electrical devices. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present disclosure.

The ink-jet print head preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electro pneumatic, electrostatic, rapid ink heating, magneto hydrodynamic, or any other technique well known to those skilled in the art. The deposited ink patterns typically undergo a curing step or another processing step before subsequent layers are applied.

While ink jet printing is preferred, the term "printing" is intended to include all forms of printing and coating, including: pre-metered coating such as patch die coating, slot or extrusion coating, slide or cascade coating, and curtain coating; roll coating such as knife over roll coating, forward and reverse roll coating; gravure coating; dip coating; spray coating; meniscus coating, spin coating, brush coating, air knife coating; screen printing processes; electrostatic printing processes; thermal printing processes; and other similar techniques.

Figure 17:
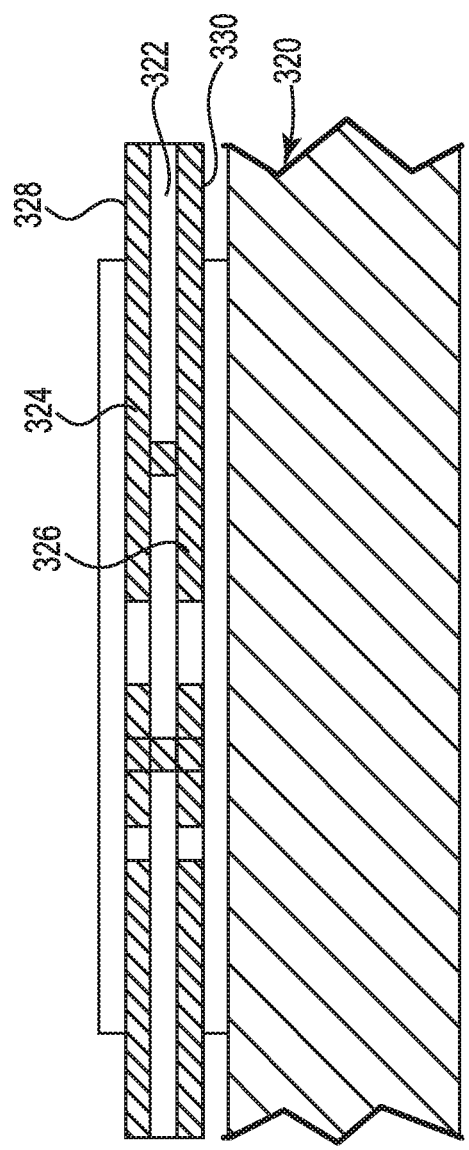
FIG. 17 illustrates an alternate high density electrical circuit with printed compliant electrical pads to plug into another connector in accordance with an embodiment of the present disclosure.

FIG. 17 illustrates an alternate high density electrical circuit 320 with compliant material 322 added between circuit geometries 324, 326 to facilitate insertion of circuit geometries 328, 330 into a receptacle or socket. The compliant material 322 can supplement or replace the compliance in the receptacle or socket. In one embodiment, the compliance is provided by a combination of the compliant material 322 and the exposed circuit geometries 328, 330.

Figure 18:
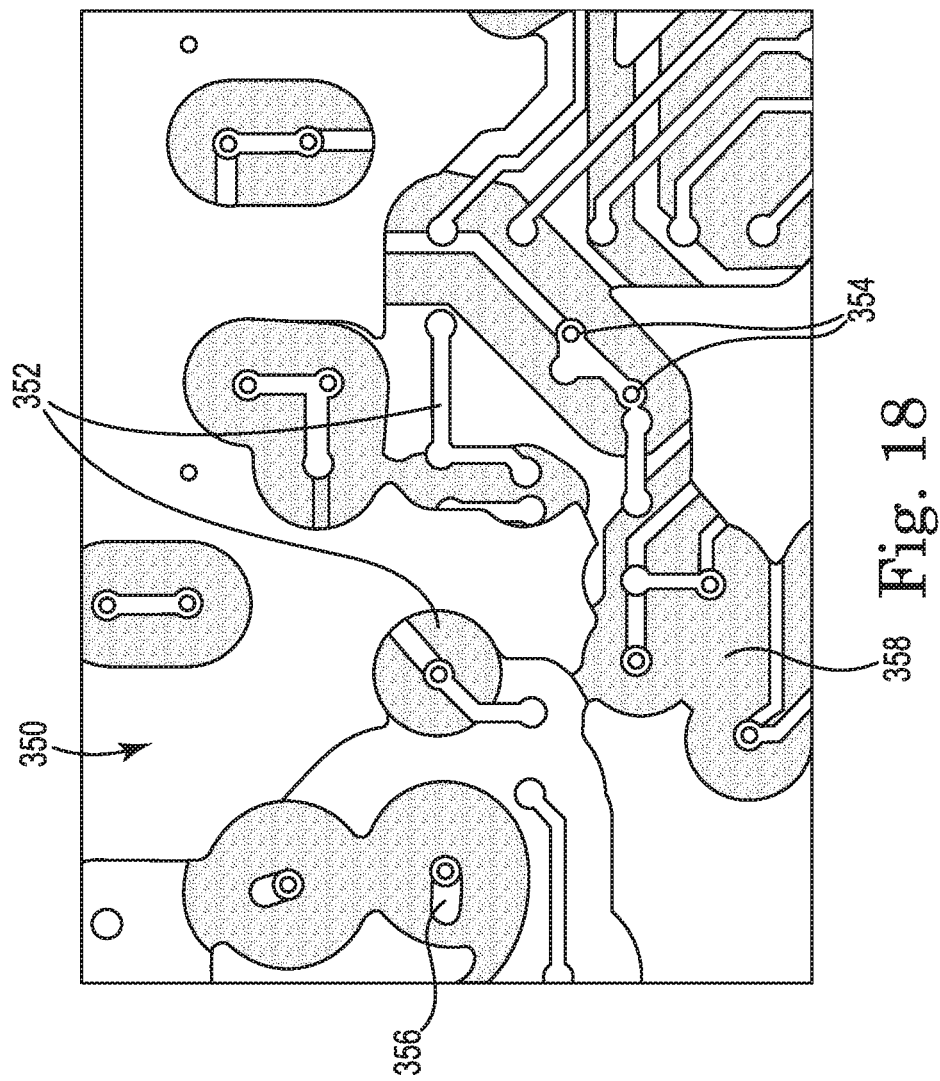
FIG. 18 is a top view of a high density electrical circuit in accordance with an embodiment of the present disclosure.

FIG. 18 illustrates the unique nature of the present high density circuit construction, where the various circuits and via locations are surrounded by the deposited dielectric within a single layer, rather than layer by layer differential in dielectric or laminate material as seen with conventional methods. In this example, lower level circuit structures 352, 356 are visible through an optically transparent metalized dielectric. Metalized dielectric 350 and printed dielectric 358 can exist in the same layers. Optically imaged via structures 354 span multiple layers.

Figure 19:
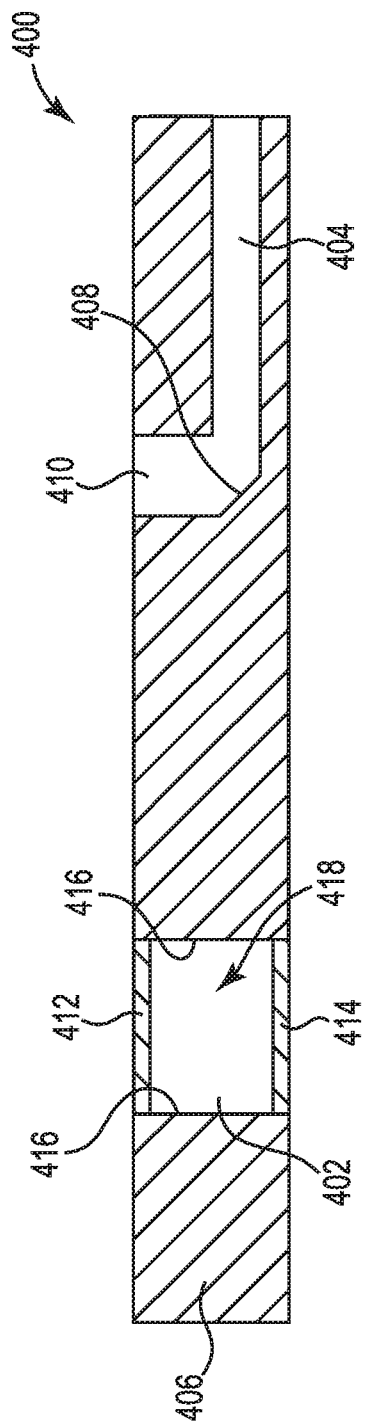
FIG. 19 is a side view of an alternate high density circuit with RF wave guides in accordance with an embodiment of the present disclosure.

FIG. 19 illustrates a high density circuit 400 with optical waveguides in accordance with an embodiment of the present disclosure. Metalized channels 402, 404 can function as RF waveguides, embedded antennae, embedded microstrip, and the like. The channels 402, 404 can be metalized using the electro-less plating discussed herein. In one embodiment, the channels 402, 404 in the dielectric 406 are filled with optical transmission material. The channels 402, 404 can optionally be sealed or encapsulated by subsequent dielectric layers.

In another embodiment, the channel 404 includes optional directional mirror 408 to direct the light with low loss in the X and Y planes in ways that are not possible to bend glass fiber. In the illustrated embodiment, the mirror 408 creates an Z-axis optical via 410.

Figure 20:
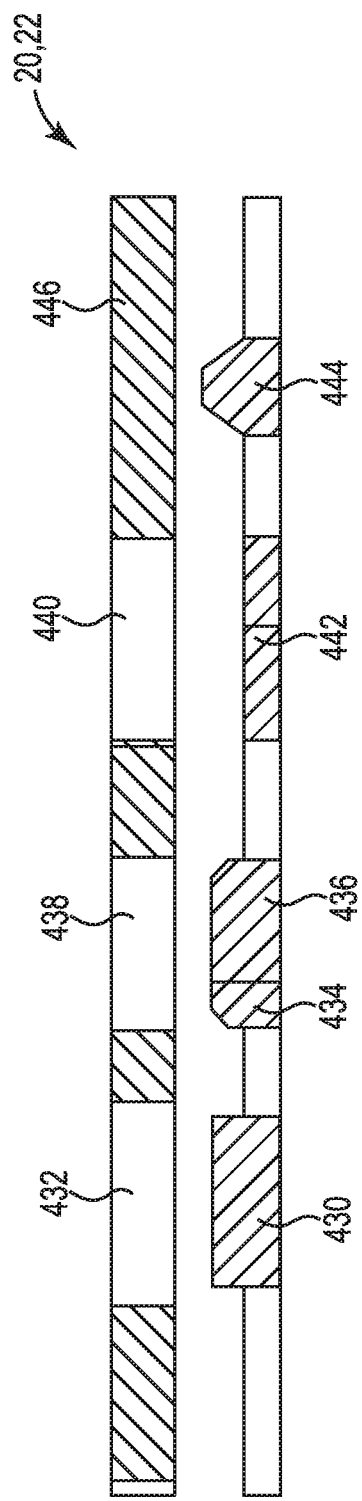
FIG. 20 is a side view of various methods of coupling a high density circuit with a low density circuit in accordance with an embodiment of the present disclosure.

In yet another embodiment, metal circuits 412, 414 are created at the top and bottom of the channel 402, and/or on the side walls 416 of the channel 402. The channel 402 is preferably filled with the appropriate optical material 418. The combined or hybrid channel 402 can act as an optical waveguide through the optical material, with an RF signal passing through the optical material of a given dielectric constant guided by the Metalized surfaces 412, 414. The photonic source can be external to the high density circuit 400 or embedded within the circuit 400 and activated by the appropriate metal circuitry. FIG. 20 illustrates an embodiment for merging a high density circuit 22 with a low density circuit 20 in accordance with an embodiment of the present disclosure. Assuming the high density circuit is created as a discrete structure separate from the low density circuit 20, various methods can be used to merge the two circuit structures 20, 22. For example, FIG. 20 illustrates various termination points that can be formed on the high density coupon 22 and/or the low density board 20.

In the left hand side of FIG. 20, copper pillar 430 is plated up to correspond to a through hole 432 in the mating circuit such that the post 430 resides inside the hole 432. The hole 432 is slightly larger than the post 430 for alignment purposes and the two 430, 432 are plated together. The center left version shows a post 434 with a tapered top 436 that is essentially a friction or slight deformation fit to mechanically join with the recess 438. The center right shows a through hole 440 and a corresponding pad or trace 442 that align with the hole 440. The two features 440, 442 are preferably plated together. The right hand shows a stud bump or plated bump 444 that is configured to pierce the circuit layer 446. Each of these types of interfaces can be on the high density coupon 22, or on the low density circuit 20 or a mixture of both locations as well as a mixture of types within the same construction. In practice, the interconnect points are typically buried by the final solder mask and reinforced mechanically, or they may reside directly under the high density coupon 22 in some cases.

An alternate method is to mimic the traditional build up process, a portion of the final copper layer on the low density base board 20 is designed and structured to act as the first circuit layer 32A for the high density circuit 22 (see FIG. 2A). The high density circuit 22 is then constructed directly on the low density circuit 20 at that location as described herein. Once the high density circuit 22 is processed and terminate in a manner desired to facilitate subsequent component mounting to the high density circuit 22, a final solder mask is applied to fully encapsulate the high density regions 22 and leave desired high density terminals flush with the final solder mask. The resulting hybrid structure 30 appears to resemble a board that was built entirely with the low density process, but actually contains the high density regions deposited and grown in place with underlying circuit structures encapsulated and reinforced with the final solder mask layer.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the disclosure. The upper and lower limits of these smaller ranges which may independently be included in the smaller ranges is also encompassed within the embodiments of the disclosure, subject to any specifically excluded limit in the stated range. Where the stated range includes one or both of the limits, ranges excluding either both of those included limits are also included in the embodiments of the present disclosure.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the present disclosure is not entitled to antedate such publication by virtue of prior invention. Further, the dates of publication provided may be different from the actual publication dates which may need to be independently confirmed.

Other embodiments of the disclosure are possible. Although the description above contains much specificity, these should not be construed as limiting the scope of the disclosure, but as merely providing illustrations of some of the presently preferred embodiments of this disclosure. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the disclosure. Thus, it is intended that the scope of the present disclosure herein disclosed should not be limited by the particular disclosed embodiments described above.

Thus the scope of this disclosure should be determined by the appended claims and their legal equivalents. Therefore, it will be appreciated that the scope of the present disclosure fully encompasses other embodiments which may become obvious to those skilled in the art, and that the scope of the present disclosure is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present disclosure, for it to be encompassed by the present claims. Furthermore, no element, component, or method step in the present disclosure is intended to be dedicated to the public regardless of whether the element, component, or method step is explicitly recited in the claims.

What is claimed is:

1. A method of merging a high-density circuit with a low-density circuit comprising the steps of:
   depositing a first liquid crystal polymer (LCP) layer on the low-density circuit;
   forming a plurality of first recesses in the first LCP layer;
   depositing conductive plating electro-lessly on selected surfaces of the first recesses to form a plurality of first conductive structures electrically coupled to, and extending generally perpendicular to, the low-density circuit;
   applying a plating resist to the first LCP layer;
   substantially filling the first recesses with a conductive material using electro-deposit plating to form a plurality of first conductive pillars;
   removing the plating resist;
   locating a first high-density circuit on the first LCP layer and electrically coupling the first high-density circuit with a plurality of the first conductive pillars;
   depositing a second LCP layer on the first high-density circuit layer;
   forming a plurality of second recesses in the second LCP layer;
   depositing conductive plating electro-lessly on selected surfaces of the second recesses to form a plurality of second conductive structures electrically coupled to, and extending generally perpendicular to, the first high-density circuit layer;
   applying a plating resist to the first high-density circuit layer;
   substantially filling the second recesses with a conductive material using electro-deposit plating to form a plurality of second conductive pillars;
   removing the plating resist;
   locating a second high-density circuit on the second LCP layer and electrically coupling the second high-density circuit with a plurality of the second conductive pillars;
   depositing a third LCP layer on the second high-density circuit to include a plurality of third recesses generally aligned with a plurality of contact pads on the second high-density circuit;
   plating a conductive material on surfaces of a plurality of the third recesses comprising a plurality of third conductive structure electrically coupled to the contact pads on the second high-density circuit; and
   electrically coupling contacts on an IC device to a plurality of the third conductive structures, wherein the step of electrically coupling comprises one of a flip chip attachment directly to a plurality of third conductive structures, solder balls, or wire bonding.

2. The method of claim 1 comprising the step of forming a covering layer extending across the second high-density circuit layer, the covering layer comprising a plurality of openings exposing contact pads on the second high-density circuit, layer configured to electrically couple with an IC device.

3. The method of claim 1 comprising planarizing the first LCP layer and the first conductive pillars before depositing the second LCP layer.

4. The method of claim 1 comprising the steps of: plating a conductive material on surfaces of a plurality of the third recesses comprising a plurality of third conductive structure electrically coupled to the contact pads on the second high-density circuit; and substantially filling the third recesses with a conductive material using electro-deposit plating to form a plurality of third conductive pillars electrically coupled with the contact pads on the second high-density circuit.

5. The method of claim 1 comprising the steps of: etching away portions of the second high-density circuit located in the third recesses to expose a plurality of the second conductive pillars; and substantially filling the third recesses with a conductive material using electro-deposit plating to form a plurality of third conductive pillars electrically coupled to the second conductive pillars.

6. The method of claim 1 wherein the first and second LCP layers are one of a film or a liquid.

7. A method of merging a high-density circuit with a low-density circuit comprising the steps of:
depositing a first liquid crystal polymer (LCP) layer on the low-density circuit;
forming a plurality of first recesses in the first LCP layer;
depositing conductive plating electro-lessly on selected surfaces of the first recesses to form a plurality of first conductive structures electrically coupled to, and extending generally perpendicular to, the low-density circuit;
applying a plating, resist to the first LCP layer;
substantially filling the first recesses with a conductive material using electro-deposit plating to form a plurality of first conductive pillars;
removing the plating resist;
depositing at least a second LCP layer on the first LCP layer to include a plurality of second recesses generally aligned with a plurality of the first conductive pillars;
depositing a conductive material electro-lessly on the selected surfaces of the second recesses to form a plurality of second conductive structures electrically coupled to, and extending generally perpendicular to, the first conductive pillars;
depositing a third LCP layer on the second LCP layer to include a plurality of third recesses generally aligned with a plurality of the second conductive pillars;
depositing a conductive material electro-lessly on the selected surfaces of the third recesses to form a plurality of third conductive structures electrically coupled to, and extending generally perpendicular to, the second conductive pillars; and
electrically coupling contacts on an IC device to a plurality of the third conductive structures, wherein the step of electrically coupling comprises one of a flip chip attachment directly to a plurality of third conductive structures, solder balls, or wire bonding.

8. The method of claim 7 comprising planarizing the first LCP layer and the first conductive pillars before depositing the second LCP layer.

9. The method of claim 7 comprising, the step of forming a covering layer extending across the second LCP layer, the covering layer comprising a plurality of openings exposing the second conductive structures configured to electrically couple with the contacts on an IC device.

10. The method of claim 7 comprising printing at least one electrical device on the second LCP layer and electrically coupling the electrical device to a plurality of the second conductive structures.

11. The method of claim 7 wherein the first and second LCP layers are one of a film or a liquid.

* * * * *